(12) United States Patent
Jung et al.

(10) Patent No.: US 12,340,988 B2
(45) Date of Patent: Jun. 24, 2025

(54) RING CARRIER AND SUBSTRATE TREATING SYSTEM

(71) Applicant: SEMES CO., LTD., Cheonan-si (KR)

(72) Inventors: Mun Gi Jung, Suwon-si (KR); Duk Hyun Son, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 505 days.

(21) Appl. No.: 17/744,852

(22) Filed: May 16, 2022

(65) Prior Publication Data

US 2022/0367155 A1 Nov. 17, 2022

(30) Foreign Application Priority Data

May 17, 2021 (KR) .......................... 10-2021-0063450

(51) Int. Cl.
*H01J 37/32* (2006.01)
*H01L 21/68* (2006.01)

(52) U.S. Cl.
CPC .. *H01J 37/32642* (2013.01); *H01J 37/32899* (2013.01); *H01L 21/681* (2013.01); *H01J 2237/3342* (2013.01)

(58) Field of Classification Search
CPC .......... H01J 37/32642; H01J 37/32899; H01J 2237/3342; H01J 37/32715; H01L 21/681; H01L 21/6732; H01L 21/67069; H01L 21/67167; H01L 21/67201
See application file for complete search history.

(56) References Cited

U.S. PATENT DOCUMENTS

| | | | | |
|---|---|---|---|---|
| 2017/0113355 A1* | 4/2017 | Genetti | ................ | B25J 11/0095 |
| 2017/0117170 A1* | 4/2017 | Wong | .................. | H01L 21/6732 |
| 2017/0117172 A1* | 4/2017 | Genetti | ............. | H01L 21/68707 |
| 2018/0019142 A1* | 1/2018 | Wong | ................ | H01L 21/67201 |
| 2019/0252234 A1* | 8/2019 | Genetti | ............. | H01L 21/68707 |
| 2020/0075430 A1* | 3/2020 | Sevillano | .......... | H01L 21/67294 |
| 2020/0373194 A1 | 11/2020 | Volfovski et al. | | |
| 2021/0020476 A1* | 1/2021 | Harbert | ............. | H01L 21/67379 |
| 2022/0093374 A1* | 3/2022 | Son | .................... | H01L 21/67769 |
| 2022/0367155 A1* | 11/2022 | Jung | ................ | H01J 37/32642 |
| 2022/0384147 A1* | 12/2022 | Lee | .................... | H01J 37/32027 |
| 2022/0384160 A1* | 12/2022 | Lee | .................... | H01L 21/68742 |

FOREIGN PATENT DOCUMENTS

| | | | | |
|---|---|---|---|---|
| CN | 109950193 A | * | 6/2019 | ......... C23C 16/4401 |
| JP | 2926213 | | 5/1999 | |
| JP | 2004200219 | | 7/2004 | |
| JP | 2013258260 | | 12/2013 | |
| JP | 2017098540 | | 6/2017 | |
| JP | 2021034390 | | 3/2021 | |

(Continued)

OTHER PUBLICATIONS

Office Action from the Korean Intellectual Property Office dated Nov. 3, 2022.
Office Action from the Japan Patent Office dated Aug. 1, 2023.

*Primary Examiner* — Jeffrie R Lund

(57) ABSTRACT

Disclosed is a ring carrier used for transferring a ring member. The ring carrier includes a body having a plate shape, and a guide part protruding from an upper surface of the body to face an inner periphery of the ring member, and an alignment hole used when the ring carrier is aligned is formed in the body to pass through the body.

20 Claims, 19 Drawing Sheets

(56) References Cited

FOREIGN PATENT DOCUMENTS

| KR | 10-2009-0097170 A |   | 9/2009 |   |
|----|-------------------|---|--------|---|
| KR | 10-2017-0054248 A |   | 5/2017 |   |
| KR | 10-2021-0030917   |   | 3/2021 |   |
| KR | 20220095644 A     | * | 7/2022 |   |
| WO | WO-2022172827 A1  | * | 8/2022 | ........ H01J 37/32642 |

\* cited by examiner

RING CARRIER AND SUBSTRATE TREATING SYSTEM

CROSS-REFERENCE TO RELATED APPLICATIONS

This application claims priority under 35 U.S.C. § 119 to Korean Patent Application No. 10-2021-0063450 filed on May 17, 2021, in the Korean Intellectual Property Office, the disclosures of which are incorporated by reference herein in their entireties.

BACKGROUND

Embodiments of the present disclosure described herein relate to a ring carrier and a substrate treating system.

Plasma refers to an ionized gaseous state including ions, radicals, and electrons. The plasma is generated by very high temperature, strong electric fields, or radio frequency (RF) electromagnetic fields. A semiconductor device manufacturing process may include an etching process of removing a thin film formed on a substrate, such as a wafer, by using plasma. The etching process is performed as ions and/or radicals of plasma collide with a thin film on a substrate or react with a thin film.

An apparatus for treating a substrate by using plasma includes a process chamber, a support chuck (for example, an ESC) that supports a substrate in the process chamber and is connected to an RF power source, and a focusing ring that surrounds an outer periphery of the substrate seated on the support chuck. The focusing ring is installed to distribute plasma with a high uniformity, and is etched together with the substrate with plasma. When the substrate is repeatedly etched, the focusing ring also is etched so that the shape of the focusing ring gradually changes. A direction, in which ions and/or radicals are input to the substrate, is changed according to a change in the shape of the focusing ring and thus the etching characteristics of the substrate is changed. Accordingly, when a specific number or more of substrates are etched or the shape of the focusing ring is changed to deviate from an allowable range, it is replace the focusing ring.

In general, the focusing ring is exchanged by, by an operator, opening the process chamber, extracting the focusing ring from the opened process chamber, and mounting an unused focusing ring on the process chamber. However, the exchange scheme much work time is consumed, and a possibility of particles being introduced into the process chamber is high. Accordingly, in recent years, an exchange scheme, in which the transfer robot of the substrate treating apparatus carries out the used focusing ring from the process chamber and carries the used focusing ring into the ring pod, and then the transfer robot carries out a new focusing ring from the ring pod and carries the new focusing ring into the process chamber, has been used.

Meanwhile, the focusing ring is transferred by the transfer robot that transfers the substrate. However, shapes and sizes of the focusing ring and the substrate are different. Accordingly, for the transfer robot to transfer both of the focusing ring and the substrate, the transfer hand has to have a structure that may support both of the focusing ring and the substrate. Because the focusing ring has a diameter that is larger than that of the substrate, a size of the transfer hand also has to become larger for the transfer hand to have the structure that may support both of the focusing ring and the substrate.

However, when the size of the transfer hand becomes larger, a danger of the transfer hand colliding other components of the substrate treating apparatus increases as the location of the transfer hand is changed. Furthermore, when the size of the transfer hand becomes larger, it is difficult for the transfer hand to enter the ring pod having a relatively small volume.

Furthermore, when the focusing ring is transferred by using the transfer hand, it is important to stably transfer the focusing ring. When the focusing ring is slid while the transfer hand transfers the focusing ring, the location, at which the focusing ring is transferred to the process chamber, varies. This may generate an error at a mounting location of the focusing ring in the process chamber, and may generate a defect in the treated substrate. Similarly, when the focusing ring is distorted while the transfer hand transfers the focusing ring, the focusing ring may not be properly mounted in the process chamber. The focusing ring has a flat zone for making a mounting direction of the focusing ring constant, and a location of the flat zone may be changed due to the distortion whereby the focusing ring may not be properly mounted on the process chamber.

SUMMARY

Embodiments of the present disclosure provide a ring carrier that may effectively transfer a ring member, and a substrate treating system.

Embodiments of the present disclosure also provide a ring carrier that allows a ring member to be transferred while a structure of a transfer hand is not changed, and a substrate treating system.

Embodiments of the present disclosure also provide a ring carrier that may minimize sliding and distortion of a ring member when the ring member is transferred, and a substrate treating system.

The aspect of the present disclosure is not limited thereto, and other unmentioned aspects of the present disclosure may be clearly appreciated by those skilled in the art from the following descriptions.

According to an embodiment of the present invention, a ring carrier for transferring a ring member includes a body having a plate shape and an alignment hole, the alignment hole passing through the body, a guide part protruding from an upper surface of the body to face an inner periphery of the ring member, and an alignment hole passing through the body and configured to align the ring carrier in a predetermined direction.

According to an embodiment of the present invention, a substrate treating system includes a first chamber provided with a transfer robot having a transfer hand, a second chamber connected to the first chamber, a ring carrier supporting a ring member during a time when the ring member is transferred between the first chamber and the second chamber, and an alignment unit attached to the first chamber and configured to rotate the ring carrier to a predetermined direction. The ring carrier includes a body having a disk shape, a guide boss configured to prevent the ring member positioned on the body of the ring carrier from sliding during a time when the ring member is transferred between the first chamber and the second chamber, and an alignment hole passing through the body. The alignment unit is configured to rotate the ring carrier such that the alignment hole of the ring carrier is aligned to the predetermined direction.

According to an embodiment of the present invention, a substrate treating system includes an index chamber provided with a transfer robot, an interior of the index chamber being maintained at an atmospheric pressure, a process chamber configured to treat a substrate by using plasma, a load lock chamber disposed between the index chamber and the process chamber, an interior of load lock chamber being at one of the atmospheric pressure and a vacuum pressure lower than the atmospheric pressure, a ring carrier configured to transfer a ring member among the process chamber, the load lock chamber, and the index chamber, and a controller. The controller controls the transfer robot such that a hand of the transfer robot transfers the ring carrier positioned on the ring member between the load lock chamber and the index chamber. The ring carrier includes a body having a disk shape, a guide part protruding from an upper surface of the body to face a flat zone of the ring member, and an alignment hole passing through the body.

The ring carrier is aligned to a predetermined direction using the alignment hole.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
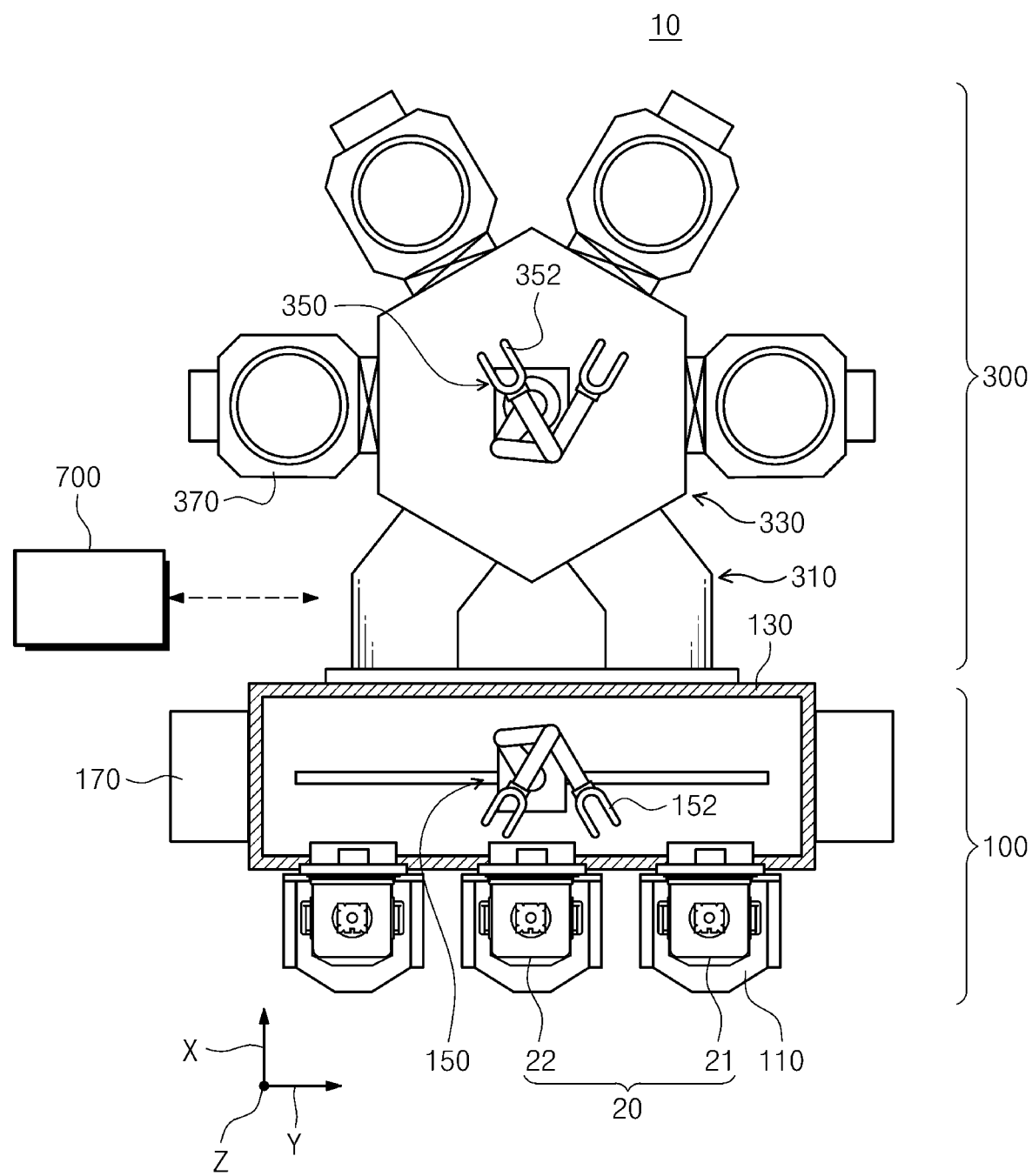
FIG. 1 is a plan view schematically illustrating a substrate treating system according to an embodiment of the present disclosure.

Hereinafter, embodiments of the present disclosure will be described in detail with reference to the accompanying drawings so that those skilled in the art, to which the present disclosure pertains, may easily carry out the present disclosure. However, the present disclosure may be implemented in various different forms, and is not limited to the embodiments, which will be described below. Furthermore, in a detailed description of embodiments of the present disclosure, a detailed description of related known functions or configurations may be omitted when it may make the essence of the present disclosure unnecessarily unclear. In addition, the same reference numerals are used for parts that perform similar functions and operations throughout the drawings.

The expression of 'including' some elements may mean that another element may be further included without being excluded unless there is a particularly contradictory description. In detail, the terms "including" and "having" are used to designate that the features, the numbers, the steps, the operations, the elements, the parts, or combination thereof described in the specification are present, and may be understood that one or more other features, numbers, step, operations, elements, parts, or combinations thereof may be added.

The terms of a singular form may include plural forms unless otherwise specified. Furthermore, in the drawings, the shapes and sizes of the elements may be exaggerated for clearer description.

The terms such as first and second may be used to describe various elements, but the elements are not limited to the terms. The terms may be used only for the purpose of distinguishing one element from another element. For example, while not deviating from the scope of the present disclosure, a first element may be named as a second element, and similarly, the second element may be named as the first element.

When it is mentioned that one element is "connected to" or "electrically connected to" another element, it should be understood that the first element may be directly connected or electrically connected to the second element but a third element may be provided therebetweeen. On the other hand, when it is mentioned that an element is "directly connected to" or "directly electrically connected to" another element, it should be understood that a third element is not present between them. It should be construed that other expressions that describe the relationships between elements, such as "between", "directly between", "adjacent to", and "directly adjacent to" may have the same purpose.

In addition, unless defined otherwise, all terms used herein, including technical or scientific terms, have the same meanings as those generally understood by those skilled in the art to which the present disclosure pertains. The terms defined in the generally used dictionaries should be construed as having the meanings that coincide with the meanings of the contexts of the related technologies, and should not be construed as ideal or excessively formal meanings unless clearly defined in the specification of the present disclosure.

Hereinafter, embodiments of the present disclosure will be described in detail with reference to FIGS. 1 to 25.

FIG. 1 is a view schematically illustrating a substrate treating system according to an embodiment of the present disclosure. Referring to FIG. 1, the substrate treating system according to an embodiment of the present disclosure may include a substrate treating apparatus 10, a container 20, and a ring carrier 30 (see, FIG. 7, for example).

The container 20 according to an embodiment of the present disclosure may be positioned on a load pot 110 of the substrate treating apparatus 10. The container 20 may be positioned on the load pot 110 of the substrate treating apparatus 10 by an overhead transport (OHT) apparatus. Various articles may be received in the container 20. The container 20 may include various kinds of containers according to kinds of the received articles. The container 20 may be called as an FOUP or a POD.

Figure 2:
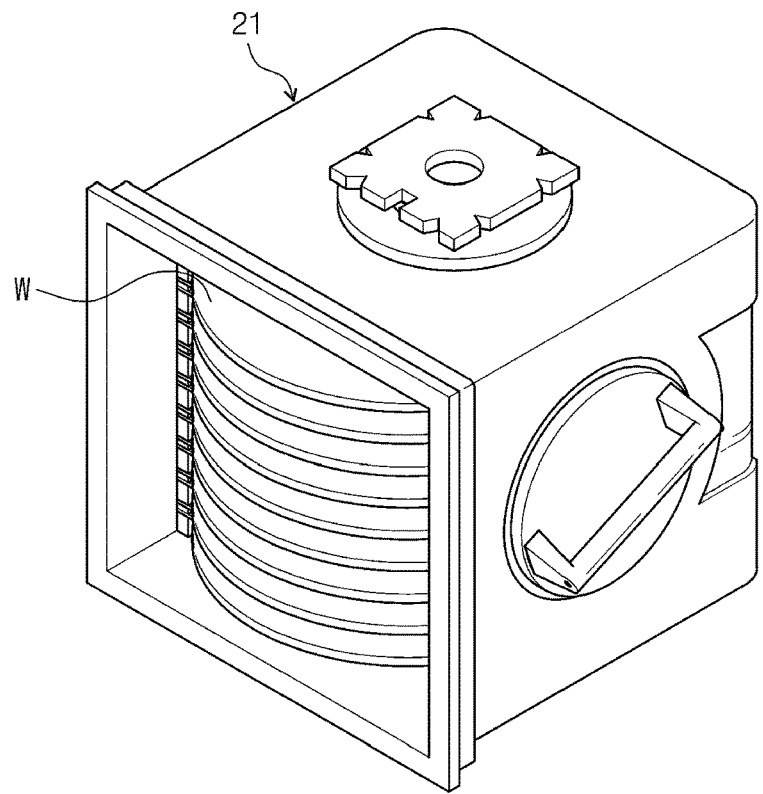
FIG. 2 is a perspective view illustrating an appearance of a first container of FIG. 1.
Figure 3:
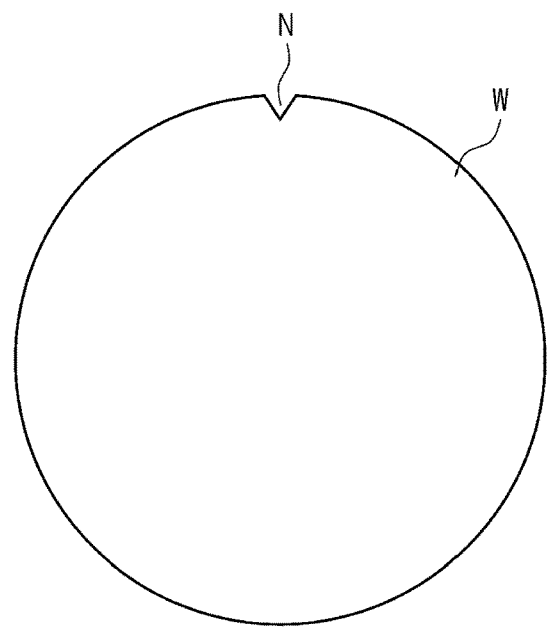
FIG. 3 is a view illustrating an appearance of a substrate received in a first container of FIG. 2.

For example, as illustrated in FIG. 2, a treated object that is treated by the substrate treating apparatus 10 may be received in a first container 21 that is any one of the containers 20. The treated object may be a substrate "W" such as a wafer illustrated in FIG. 3. Furthermore, a notch "N" may be formed in the substrate "W". To properly treat the substrate "W" with the substrate treating apparatus 10, it is necessary to accurately transfer the substrate "W" to a desired location of the substrate treating apparatus 10. The notch "N" formed in the substrate "W" is used to align the substrate "W" for accurate transfer thereof. The alignment of the substrate "W" may be made through an alignment unit 200 as will be described later.

Figure 4:
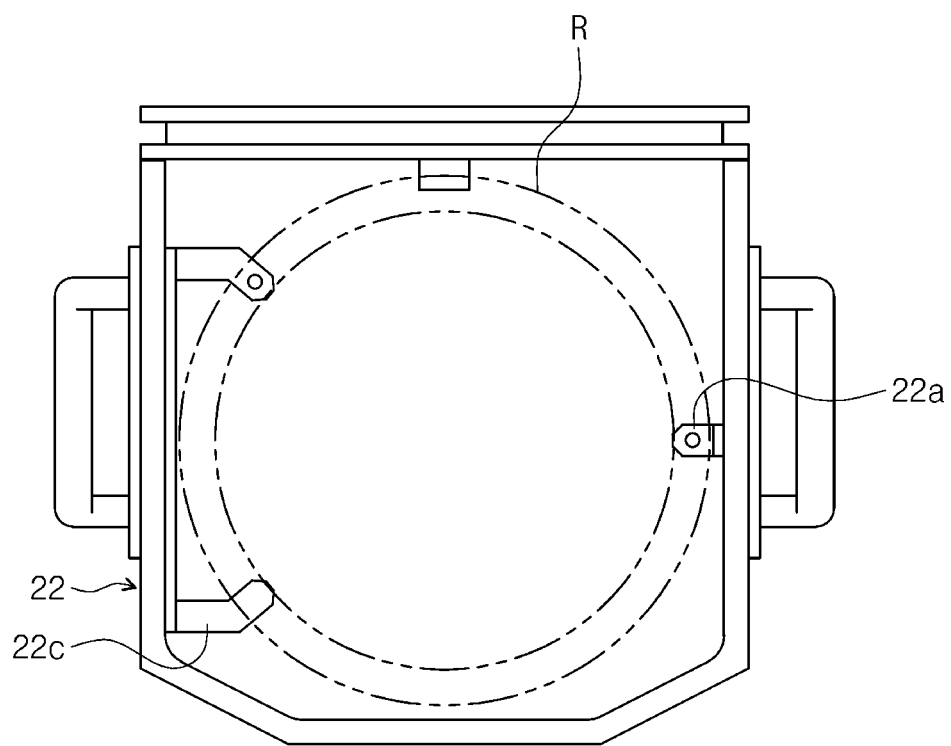
FIG. 4 is a plan cross-sectional view illustrating an appearance of a second container of FIG. 1.

Furthermore, as illustrated in FIG. 4, an expendable component that is mounted on the substrate treating apparatus 10 and is exchangeable may be received in a second container 22 that is another one of the containers 20. The expendable component may be a ring member "R", such as a focusing ring or a dielectric ring. A diameter of an outer periphery of the ring member "R" may be larger than a diameter of an outer periphery of the substrate "W". Accordingly, a volume of a space in the second container 22 may be rather larger than that of a space in the first container 21. Furthermore, a plurality of support slots 22a and 22c for supporting the ring member "R" in the second container 22 may be provided at different locations when viewed from a top. Furthermore, the support slots 22a and 22c may be disposed at locations corresponding to openings 32 formed in the ring carrier 30, which will be described below. This is because the ring carrier 30 may be prevented from interfering with the support slots 22a and 22c when the ring member "R" is carried out from the second container 22 by using the ring carrier 30.

Figure 5:
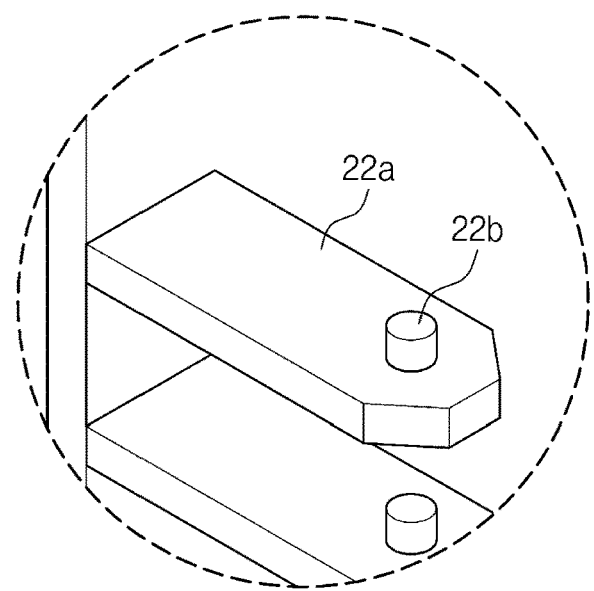
FIG. 5 is a view illustrating an appearance of a support slot of FIG. 4.
Figure 6:
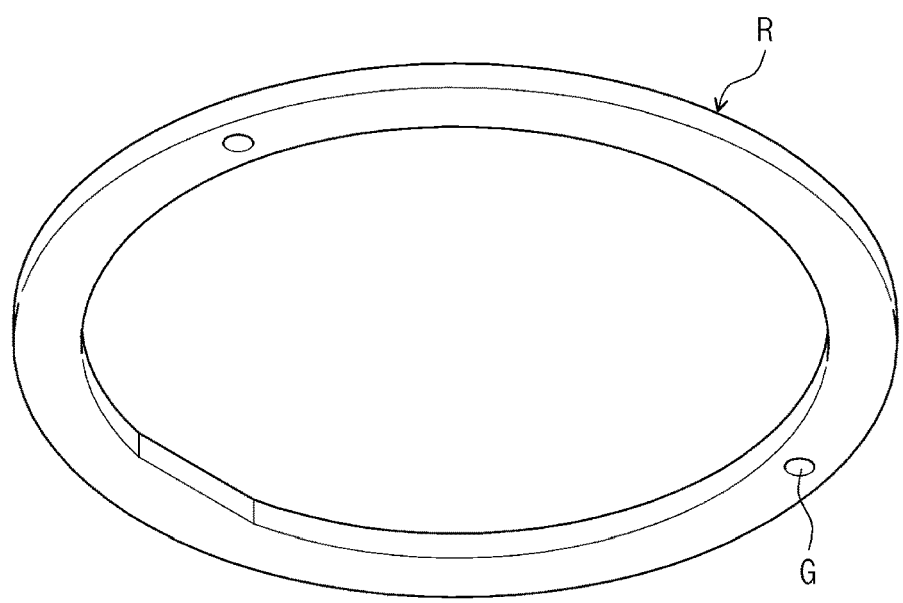
FIG. 6 is a view illustrating an appearance of a ring member received in a second container of FIG. 4.

Furthermore, an alignment pin 22b, as illustrated in FIG. 5, may be formed in, among the support slots 22a and 22c, one or more (for example, a plurality of) support slots 22a. The alignment pin 22b may be inserted into an alignment recess "G" formed on a lower surface of the ring member "R" illustrated in FIG. 6. It is important to transfer the ring member "R" at an accurate location to properly mount the ring member "R" to a desired location of the substrate treating apparatus 10. It is important to position the ring member "R" at the same location of a first transfer hand 152, which will be described below, to transfer the ring member "R" to an accurate location. The alignment pin 22b may allow the ring member "R" to be positioned at the same location of the first transfer hand 152 by restricting change of a lateral location of the ring member "R".

Furthermore, an operator may receive the ring member "R" at an accurate location in the second container 22 simply by inserting the alignment pin 22b into the alignment recess "G" formed on the lower surface of the ring member "R". A location, at which the ring member "R" is received in the second container 22, may be changed according to skillfulness of the operator, and the alignment pin 22b may minimize the problem. Furthermore, a direction of the ring member "R" aligned by the alignment pin 22b may be aligned in the same direction. For example, a flat zone of the ring member "R" aligned by the alignment pin 22b may be aligned in the same direction. For example, because the ring member "R" is aligned in the same direction by the alignment pin 22b, it is not separately necessary to align the direction of the ring member "R" for positioning the ring member "R" on the ring carrier 30.

The ring carrier 30 according to an embodiment of the present disclosure may be used to transfer the ring member "R". For example, the ring carrier 30 may be used to transfer the ring member "R" between an index chamber 130, an alignment chamber 170, and a load lock chamber 310, which will be described below. The ring carrier 30 may be received in the above-described container 20. For example, the ring carrier 30 may be received in the above-described second container 22. The ring carrier 30 may be received below the ring member "R" that is received in the second container 22. The ring carrier 30 received in the second container 22 may be received in the second container 22 while a direction thereof is aligned. The ring carrier 30 may be used to cause a first transfer robot 150, which will be described below, to transfer the ring member "R"

Figure 7:
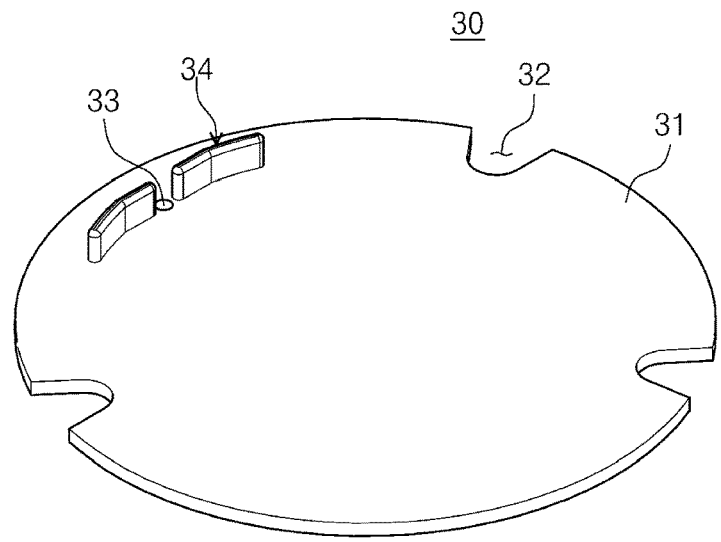
FIG. 7 is a perspective view illustrating an example of a ring carrier used to transfer a ring member.
Figure 8:
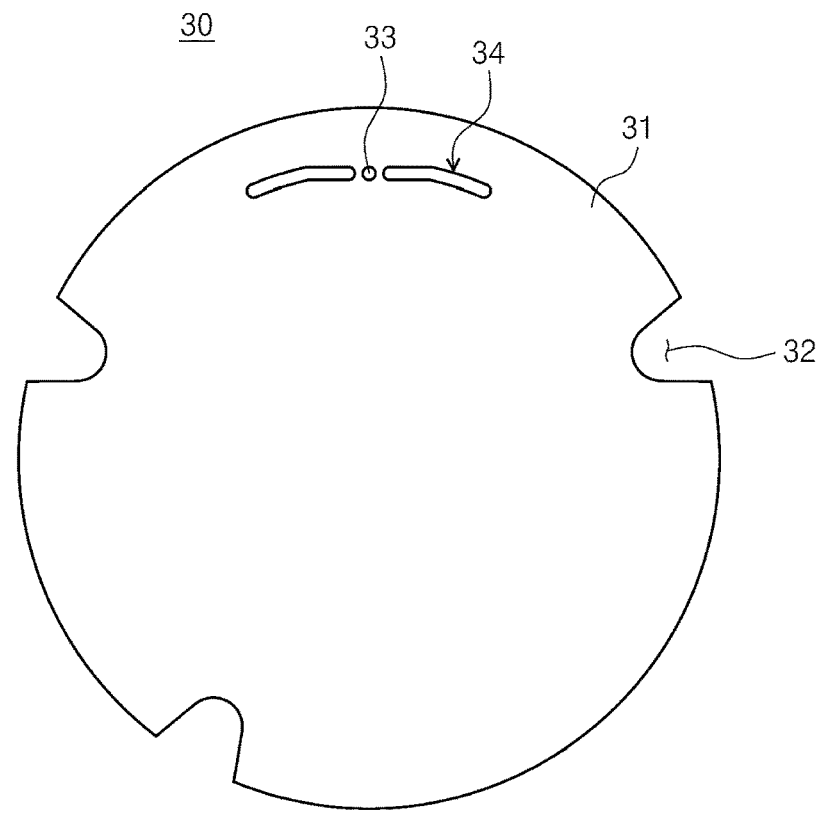
FIG. 8 is a plan view of a ring carrier of FIG. 7.
Figure 9:
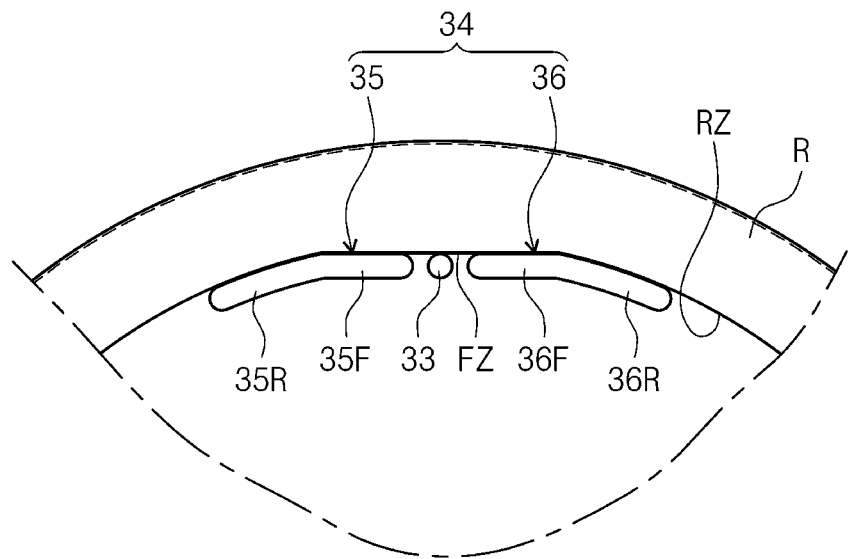
FIG. 9 is an enlarged view illustrating a portion of a ring carrier of FIG. 8.

FIG. 7 is a perspective view illustrating an example of the ring carrier used to transfer the ring member. FIG. 8 is a plan view of the ring carrier of FIG. 7. FIG. 9 is an enlarged view illustrating a portion of the ring carrier of FIG. 8. Referring to FIGS. 7 to 9, the ring carrier 30 according to an embodiment of the present disclosure may include a body 31 and a guide part 34.

The body 31 may have a seating surface, on which the ring member "R" is positioned. The ring member "R" may be positioned on an upper surface of the body 31. The body 31 may have a plate shape. The body 31 may have a disk shape. The body 31 has the disk shape to make an operation of aligning a direction of the ring carrier 30 by the alignment unit 200 the same as or at least similar to an operation of aligning a direction of the substrate "W".

A central area of the body 31 may be provided with a blocking plate having no hole. Furthermore, a plurality of openings 32 (i.e., notches) may be formed in a peripheral area of the body 31. The openings 32 may be formed in the peripheral area of the body 31. The openings 32 may extend from the upper surface to the lower surface of the body 31. That is, the openings 32 may pass through the body 31. The openings 32 may be formed in the peripheral area of the body 31, and may be formed in the peripheral area of the body 31 including the outer periphery of the body 31. That is, the openings 32 may extend to the outer periphery of the body 31. Furthermore, when the openings 32 are viewed from a top, they may be formed at locations that overlap support shelves 320 provided in the load lock chamber 310. Furthermore, when the openings 32 are viewed from a top, they may be formed at locations that overlap the support slots 22a and 22c of the second container 22. This is because the ring carrier 30 may be prevented from overlapping the support shelves 320 or the support slots 22a and 22c when the ring member "R" is transferred by using the ring carrier 30.

An alignment hole 33 may be formed in the body 31. When viewed from a top, the alignment hole 33 may be formed between a first guide part 35 and a second guide part 36. The alignment hole 33 may be a hole that is used when the alignment unit 200, which will be described below, aligns the ring carrier 30. The alignment hole 33 may extend from the upper surface to the lower surface of the body 31. That is, the alignment hole 33 may pass through the body 31. Furthermore, the alignment hole 33 may be formed at a location that overlaps the notch "N" formed in the substrate "W". For example, a distance from a center of the body 31 to a center of the alignment hole 33 may be the same as a distance from a center of the substrate "W" to a center of the notch "N". This is for the purpose of making an operation of aligning a direction of the ring carrier 30 by the alignment unit 200 the same as or at least similar to an operation of aligning a direction of the substrate "W".

When the ring member "R" is positioned on the ring carrier 30 and the ring carrier 30 is transferred by the first transfer hand 152, the ring member "R" may be slid through linear movement of the first transfer hand 152 or a seating location of the ring member "R" may be distorted through rotation of the first transfer hand 152. The guide part 34 may prevent sliding or distortion of the ring member "R". The guide part 34 also may be referred to as a guide boss.

The guide part 34 may protrude from the upper surface of the body 31. The guide part 34 may protrude upwards from the upper surface of the body 31. An inner periphery of the ring member "R" positioned on the ring carrier 30 may have a flat zone FZ and a round zone RZ, and the guide part 34 may be formed at a location that faces an inner periphery of the flat zone FZ of the ring member "R". The guide part 34 may have a shape corresponding to the inner periphery of the ring member "R". The guide part 34 may have a shape corresponding to the inner periphery of the ring member "R" including the flat zone FZ.

The guide part 34 may include the first guide part 35 (the first guide boss) and the second guide part 36 (a second guide boss). The first guide part 35 and the second guide part 36 may have symmetrical shapes. For example, the first guide part 35 and the second guide part 36 may have shapes that are symmetrical to each other with respect to the alignment hole 33 formed therebetween.

The first guide part 35 may include a first flat portion 35F and a first round portion 35R. The second guide part 36 may include a second flat portion 36F and a second round portion 36R. The first flat portion 35F may have a shape corresponding to the inner periphery of the flat zone FZ. The first round portion 35Z may be bent and extend from the first flat portion 35F, and may have a shape corresponding to the inner periphery of the round zone RZ of the ring member "R". The first flat portion 35F and the first round portion 35Z have shapes that are symmetrical to the second flat portion 36F and the second round portion 36Z, and a repeated description thereof will be omitted.

The guide part 34 helps the flat zone FZ of the ring member "R" to be aligned in a specific direction on the ring carrier 30. Furthermore, the alignment hole 33 is formed between the first guide part 35 and the second guide part 36. Accordingly, when the ring carrier 30 is aligned by using the alignment unit 200, which will be described below, a direction of the flat zone FZ of the ring member "R" positioned on the ring carrier 30 also may be aligned in a desired direction. Furthermore, outer peripheries of the first round portion 35Z and the second round portion 36Z, and the inner periphery of the round zone RZ may have the same radii of curvature. Furthermore, the outer peripheries of the first round portion 35Z and the second round portion 36Z, and the outer periphery of the substrate "W" may have the same radii of curvature.

Referring to FIG. 1 again, the substrate treating apparatus 10 according to an embodiment of the present disclosure may include an index unit 100, a process executing unit 300, and a controller 700. The index unit 100 and the process executing unit 300 may be arranged along a first direction "X" when viewed from a top. Hereinafter, a direction that is perpendicular to the first direction "X" when viewed from the top is defined as a second direction "Y". Furthermore, a direction that is perpendicular to the first direction "X" and the second direction "Y" is defined as a third direction "Z". Here, the third direction "Z" may refer to a direction that is perpendicular to a ground surface.

The index unit 100 may include the load pot 110, the index chamber 130, the first transfer robot 150, and the alignment chamber 170.

The container 20 may be seated in the load pot 110. As described above, the container 20 may be transferred to the load pot 110 by the OHT apparatus to be loaded in the load pot 110 or unloaded from the load pot 110, and may be transferred. However, the present disclosure is not limited, and the container 20 may be transferred by various devices for transferring the container 20. Furthermore, an operator may directly load the container 20 in the load pot 110 or unload the container 20 seated in the load pot 110 from the load pot 110.

The index chamber 130 may be provided between the load pot 110 and the process executing unit 300. That is, the load pot 110 may be connected to the index chamber 130. An interior of the index chamber 130 may be maintained in an atmospheric atmosphere.

Figure 10:
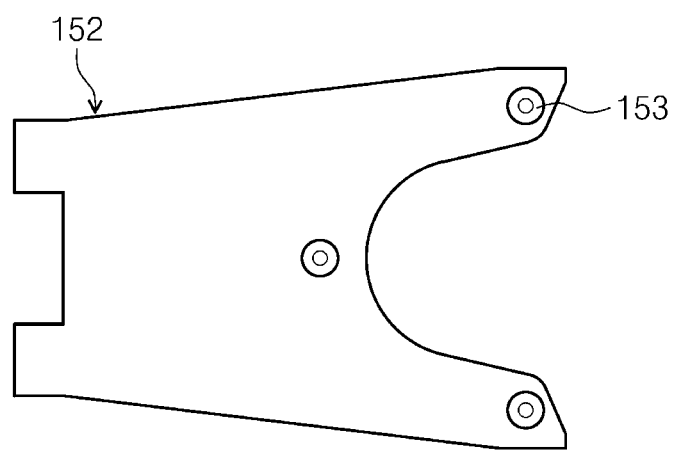
FIG. 10 is a view schematically illustrating an appearance of a first transfer hand of FIG. 1.
Figure 11:
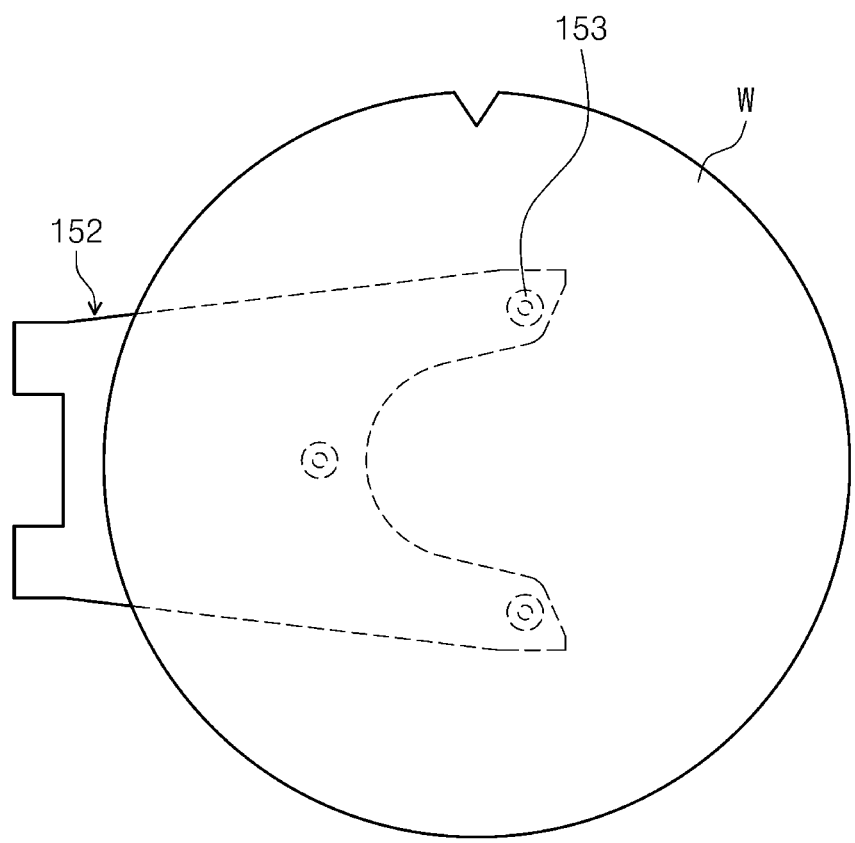
FIG. 11 is a view illustrating an appearance, in which a substrate is positioned on a first transfer hand of FIG. 10.
Figure 12:
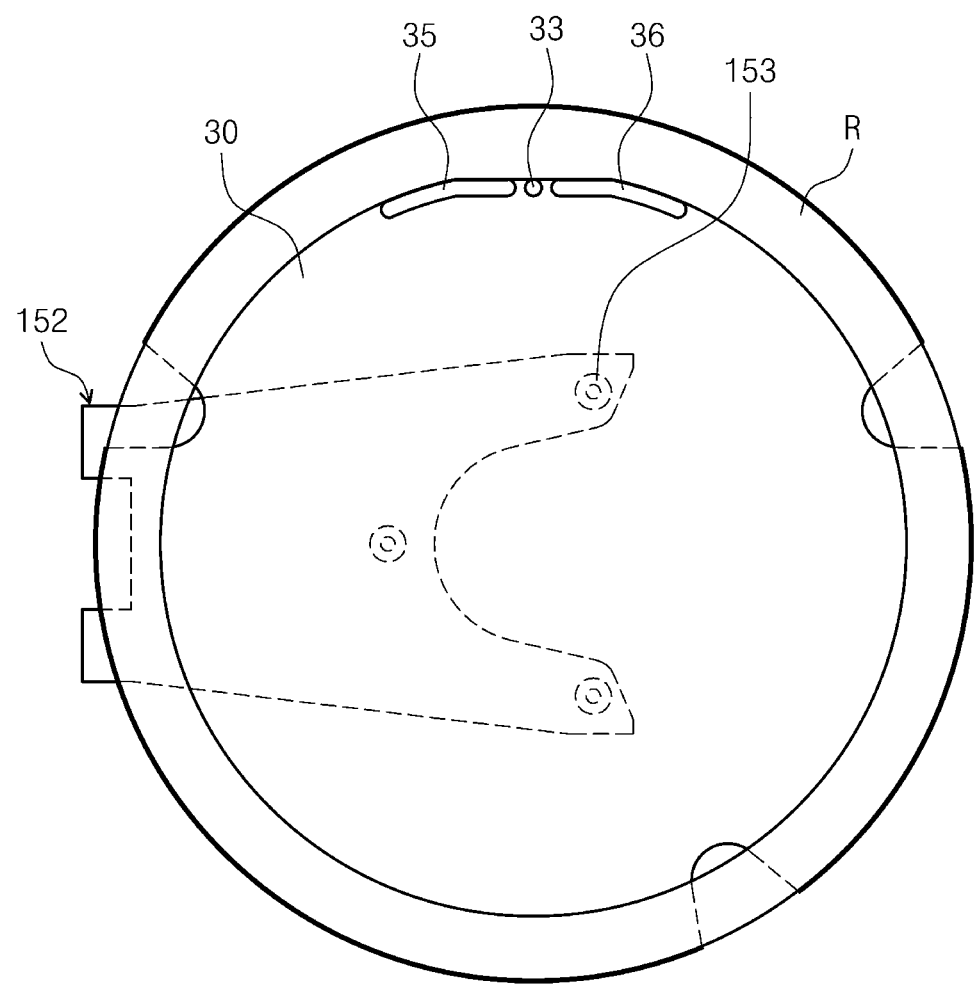
FIG. 12 is a view illustrating an appearance, in which a ring member and a ring carrier are positioned on a first transfer hand of FIG. 10.

Furthermore, the first transfer robot 150 may be provided in the index chamber 130. The first transfer robot 150 may transfer the substrate "W" and the ring member "R" between the container 20 seated in the load pot 110, the load lock chamber 310, which will be described below, and the alignment chamber 170. Furthermore, the first transfer robot 150 may have the first transfer hand 152. A plurality of first support pads 153, as illustrated in FIG. 10, may be provided on an upper surface of the first transfer hand 152. For example, three first support pads 153 may be provided, and may support a target transfer object positioned on the first transfer hand 152 at three points. The first support pad 153 may prevent sliding of the substrate "W" or the ring carrier 30 positioned on the first transfer hand 152. When viewed from a top, the first support pads 153 may be arranged along a circumferential direction of an imaginary circle having one radius. Furthermore, the first transfer hand 152 may have a size, by which it may be easily enter the above-described container 20. Furthermore, as illustrated in FIG. 11, the substrate "W" may be positioned on the first transfer hand 152, and as illustrated in FIG. 12, the ring carrier 30 that supports the ring member "R" may be positioned. In an embodiment, when the ring carrier 30 supports the ring member "R", the first guide part 35 and the second guide part 36 may contact an inner periphery of the ring member "R."

Figure 13:
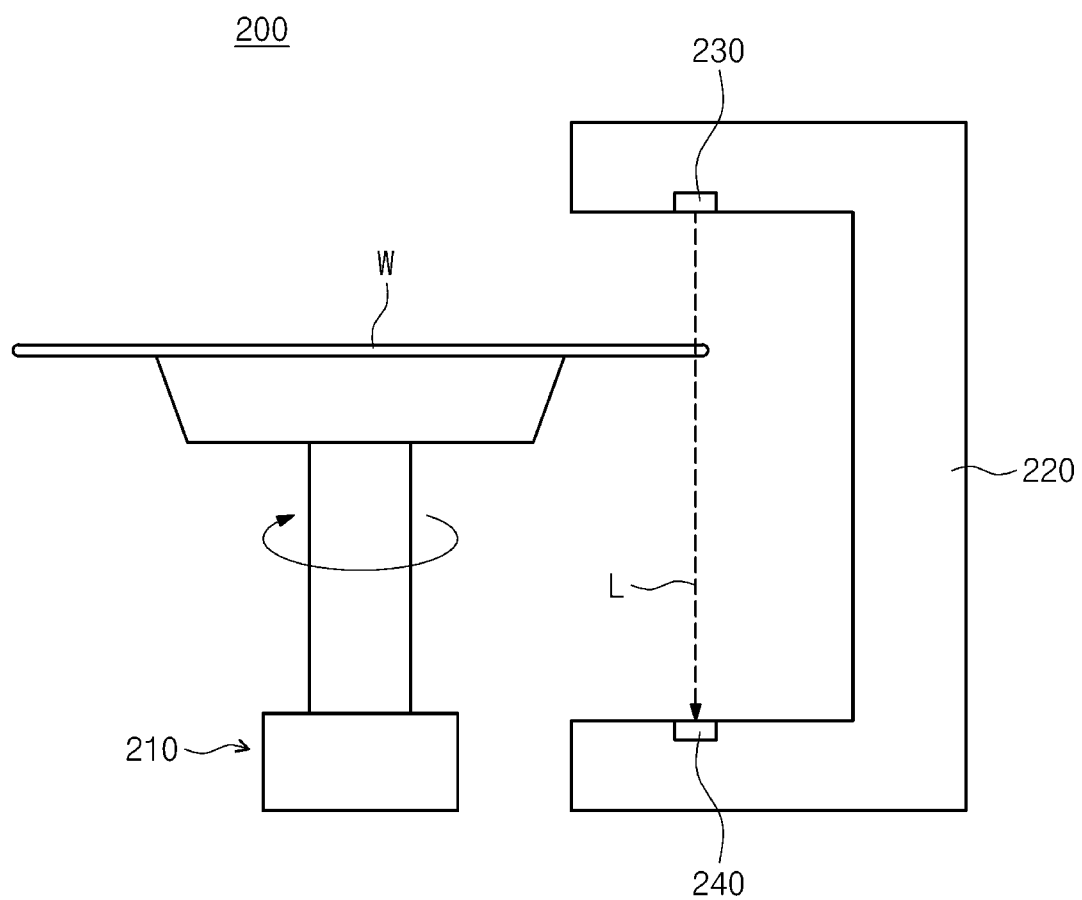
FIG. 13 is a view illustrating an appearance of an alignment unit provided in an alignment chamber of FIG. 1.

The alignment chamber 170 provided with the alignment unit 200, which will be described below, may be installed on one side and/or an opposite side of the index chamber 130. The substrate "W" or the ring carrier 30 may be aligned in the alignment chamber 170. FIG. 13 is a view illustrating an appearance of an alignment unit provided in an alignment chamber of FIG. 1. Referring to FIG. 13, the alignment unit 200 provided in the alignment chamber 170 may align the substrate "W". For example, the alignment unit 200 may align a direction of the notch "N" formed in the substrate "W". Furthermore, the alignment unit 200 may align a direction of the alignment hole 33 formed in the ring carrier 30. For example, the alignment unit 200 may align the direction of the alignment hole 33 of the ring carrier 30 to a predetermined direction. The direction of the notch "N" refers to an extending direction of an imaginary line connecting a center of the substrate "W" to a center of the notch "N" of the substrate "W". The direction of the alignment hole 33 refers to an extending direction of an imaginary line connecting a center of the ring carrier 30 to a center of the alignment hole 33 of the ring carrier 30.

The alignment unit 200 may include a chuck 210, a support mechanism 220, an irradiation part 230, and a light receiving part 240. The chuck 210 may support a central area of the substrate "W". The chuck 210 may support the substrate "W" in a vacuum absorption scheme. Unlike this, a pad that prevents sliding of a target support object may be provided on an upper surface of the chuck 210. The chuck 210 may rotate the substrate "W".

The support mechanism 220 may support the irradiation part 230 and the light receiving part 240. The irradiation part 230 may irradiate light "L" in a direction from an upper side to a lower side of the substrate "W" supported by the chuck 210. The light "L" may be a laser beam having a specific width. The light receiving part 240 may be disposed to face the irradiation part 230. For example, the light receiving part 240 may be disposed on an irradiation path of the light "L" irradiated by the irradiation part 230. The chuck 210 may rotate the substrate "W" until the light "L" irradiated by the irradiation part 230 reaches the light receiving part 240 through the notch "N" formed in the substrate "W". When the light receiving part 240 receives the light "L", the chuck 210 stops rotation of the substrate "W" and may finish alignment of the substrate "W".

Figure 14:
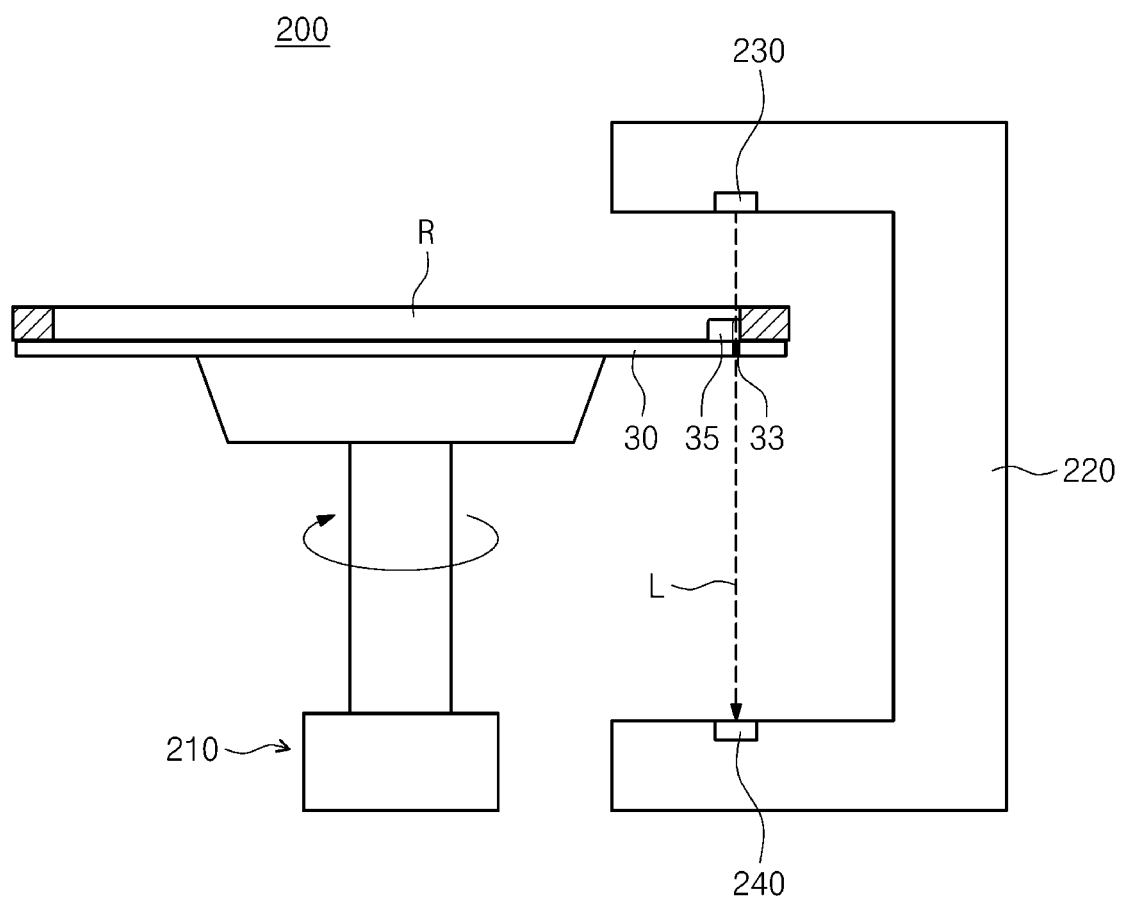
FIGS. 14 and 15 are views illustrating an appearance, in which an alignment unit of FIG. 13 aligns a ring carrier.

As illustrated in FIG. 14, the alignment unit 200 may align the ring carrier 30, similarly to the above-described scheme of aligning the substrate "W". As described above, the alignment hole 33 is formed in the ring carrier 30. When the ring carrier 30 is positioned on the chuck 210, the chuck 210 may rotate the substrate "W" until the light "L" irradiated by the irradiation part 230 reaches the light receiving part 240 through the alignment hole 33 formed in the ring carrier 30. When the light receiving part 240 receives the light "L", the chuck 210 stops rotation of the ring carrier 30 and may finish alignment of the ring carrier 30. As described above, because the location, at which the alignment hole 33 is formed, may overlap the location, at which the notch "N" is formed, the ring carrier 30 and the substrate "W" may be aligned by using the same alignment unit 200.

Figure 15:
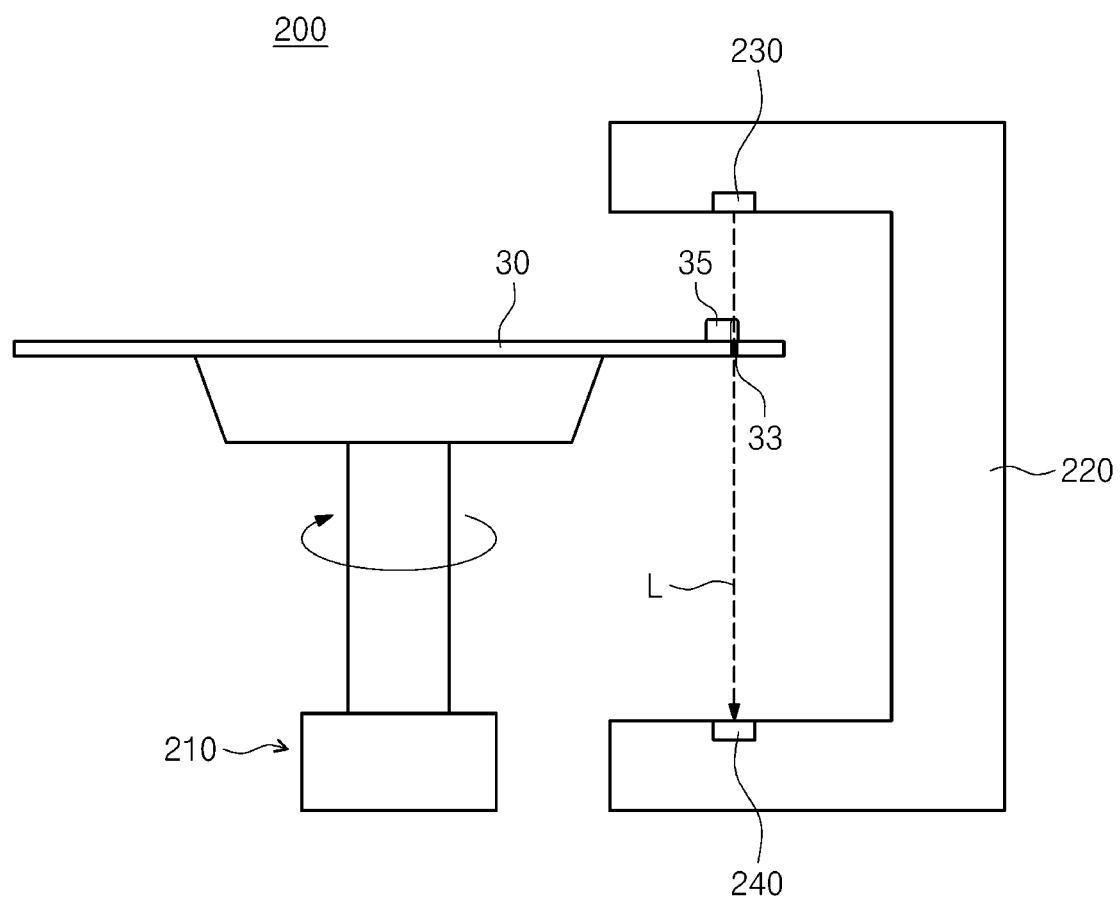

FIG. 14 illustrates as an example, that the ring carrier 30 is aligned in a state, in which the ring member "R" is positioned on the ring carrier 30, but the present disclosure is not limited thereto. If necessary, the ring carrier 30 may be aligned in a state, in which the ring member "R" is not poisoned on the ring carrier 30 as illustrated in FIG. 15.

Referring to FIG. 1 again, the process executing unit 300 may include the load lock chamber 310, a transfer chamber 330, a second transfer robot 350, and a process chamber 370.

The load lock chamber 310 may be disposed between the index chamber 130 and the transfer chamber 330. As described above, the internal atmosphere of the index chamber 130 may be maintained in an atmospheric atmosphere.

As will be described later, the internal atmosphere of the transfer chamber 330 may be maintained in the vacuum atmosphere. The load lock chamber 310 may be disposed between the index chamber 130 and the transfer chamber 330, and an internal atmosphere thereof may be changed between an atmospheric atmosphere and a vacuum pressure atmosphere.

Figure 16:
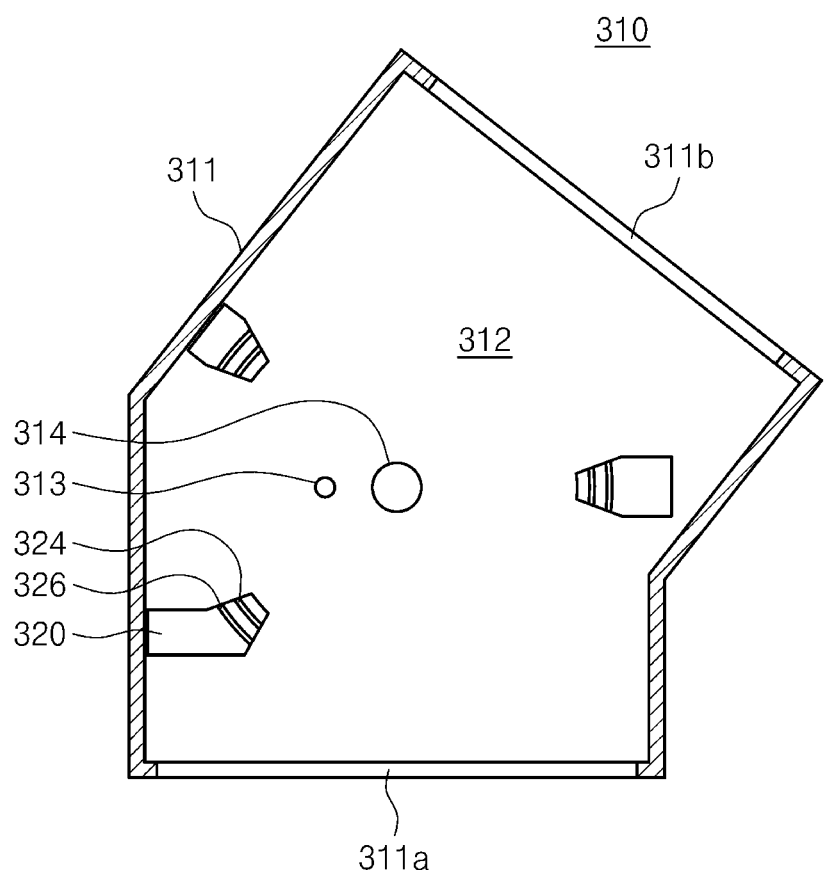
FIG. 16 is a plan cross-sectional view illustrating an appearance of a load lock chamber of FIG. 1.

FIG. 16 is a plan cross-sectional view illustrating an appearance of a load lock chamber of FIG. 1. Referring to FIG. 16, the load lock chamber 310 may include a housing 311 and the support shelves 320.

The housing 311 may have an interior space 312. The housing 311 may have the interior space 312, in which the substrate "W" or the ring member "R" is seated. The housing 311 may be disposed between the index chamber 130 and the transfer chamber 330, which have been described above. Furthermore, the housing 311 may have an opening. A plurality of openings may be provided in the housing 311. For example, a first opening 311a of the openings may be selectively communicated with the index chamber 130 by a gate valve (not illustrated). Furthermore, a second opening 311b of the openings may be selectively communicated with the transfer chamber 330 by the gate valve (not illustrated).

Furthermore, the housing 311 may have a vent hole 313, through which vent gas is supplied into the interior space 312 of the housing 311. Furthermore, the housing 311 may have a pressure-reducing hole that reduces a pressure in the interior space 312 of the housing 311. The vent gas may be an inert gas. For example, the vent gas may be a gas including nitrogen, argon, and the like. However, the present disclosure is not limited thereto, and the vent gas may be various known inert gases. Further, a pressure-reducing hole 314 may be connected to an exhaust line (not illustrated). The pressure-reducing member may be a pump. However, the present disclosure is not limited thereto, and the pressure-reducing member may be variously modified to known apparatuses that reduce the pressure of the interior space 312. As the vent hole 313 and the pressure-reducing hole 314 are formed in the housing 311, a pressure of the interior space of the housing 311 may be freely changed between the atmospheric pressure and the vacuum pressure.

The support shelves 320 may be provided in the interior space 312. The support shelves 320 may support the substrate "W" or the ring member "R" in the interior space 312. Furthermore, a diameter of the ring member "R" may be larger than that of the substrate "W".

One more support shelves 320 may be provided. For example, a plurality of support shelves 320 may be provided. Three support shelves 320 may be provided. The support shelves 320 may be provided to be spaced apart from each other when viewed from a top. When viewed from a top, the support shelves 320 may be disposed at locations that overlap the openings 32 formed in the above-described ring carrier 30. For example, when viewed from a top, the support shelves 320 may be disposed at locations that overlap the openings 32 formed in the ring carrier 30, a direction of which is aligned by the alignment unit 200. Furthermore, the support shelves 320 may have a substantially inverse "L" shape when viewed in a cross-section thereof.

Furthermore, the support shelves 320 may include a first pad 324 and a second pad 326. The first pad 324 and the second pad 326 may be formed of a material that has an anti-friction property against the substrate "W" or the ring member "R". For example, the first pad 324 and the second pad 326 may be formed of polyetheretherketone (PEEK) filled with carbon. However, the embodiment, in which the PEEK filled with carbon is used as the material of the first pad 324 and the second pad 326, is merely an example, and various modifications may be made with other known materials having similar properties.

Figure 17:
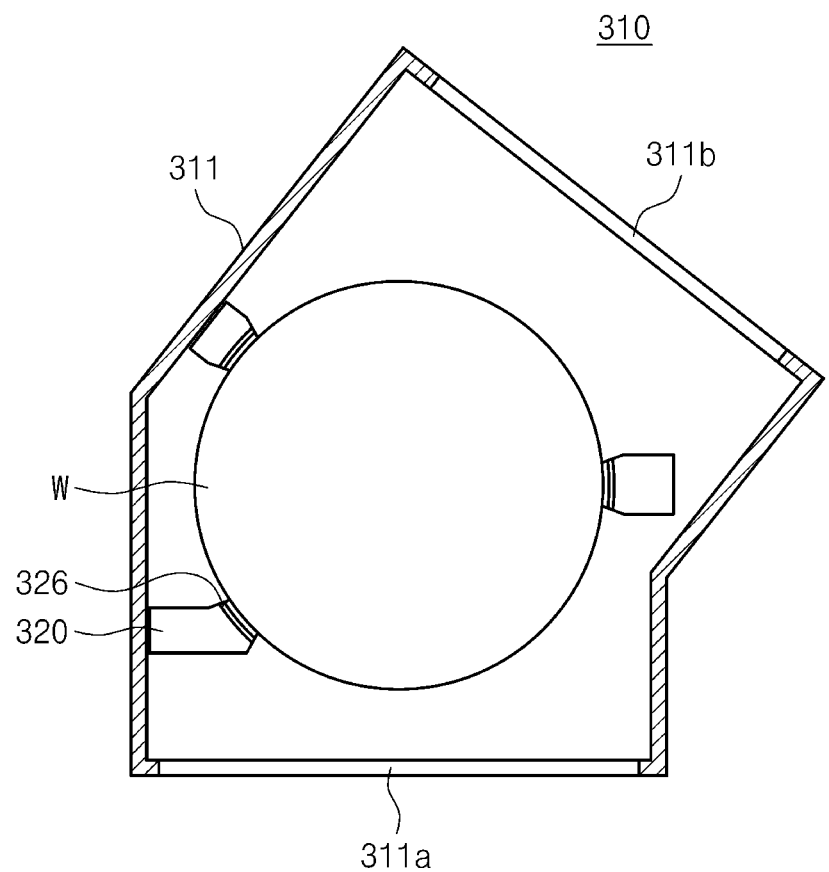
FIG. 17 is a view illustrating an appearance, in which a substrate is positioned on a support shelf of FIG. 16.

The first pad 324 may have a substantially arc shape when viewed from a top. The first pad 324 may be disposed closer to the pressure-reducing hole 314 than the second pad 326. The first pad 324 may be disposed on an inner side of an outer periphery of the substrate "W" when viewed from a top. That is, as illustrated in FIG. 17, the first pad 324 may support, among the substrate "W" and the ring member "R", the substrate "W".

The second pad 326 may have a substantially arc shape when viewed from a top. The second pad 326 may be disposed farther away from the pressure-reducing hole 314 than the first pad 324. When viewed from a top, the second pad 326 may be disposed on an outer side of the outer periphery of the substrate "W" and the inner periphery of the ring member "R", and may be disposed on an inner side of the outer periphery of the ring member "R". That is, the second pad 326 may support, among the substrate "W" and the ring member "R", the ring member "R".

Figure 18:
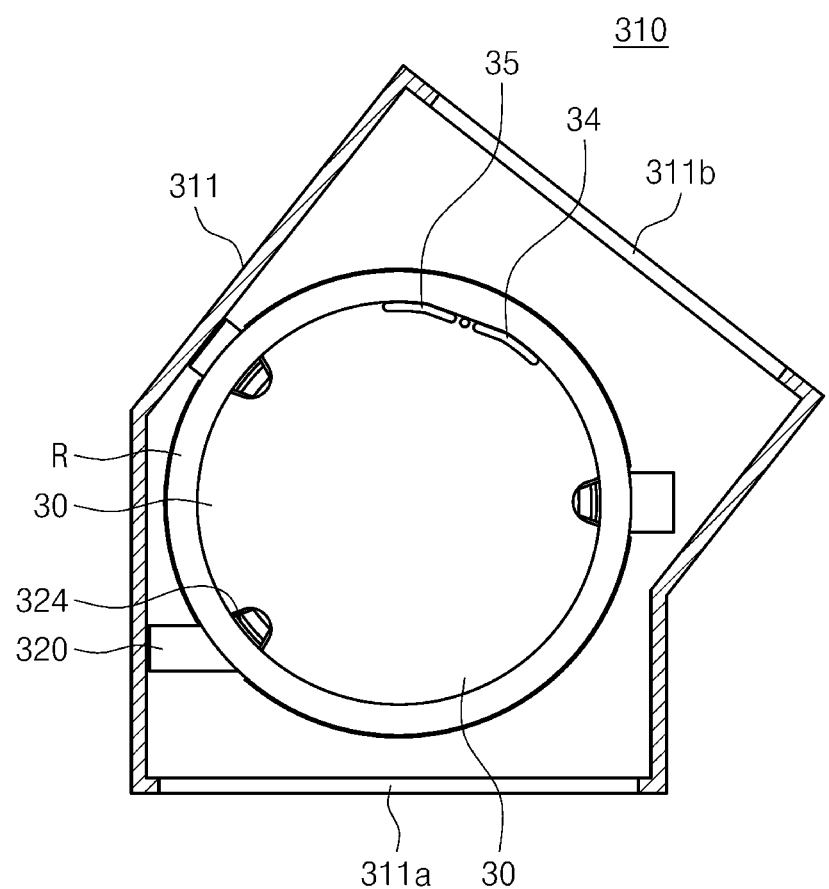
FIG. 18 is a view illustrating an appearance, in which a ring member is positioned on a support shelf of FIG. 16.
Figure 19:
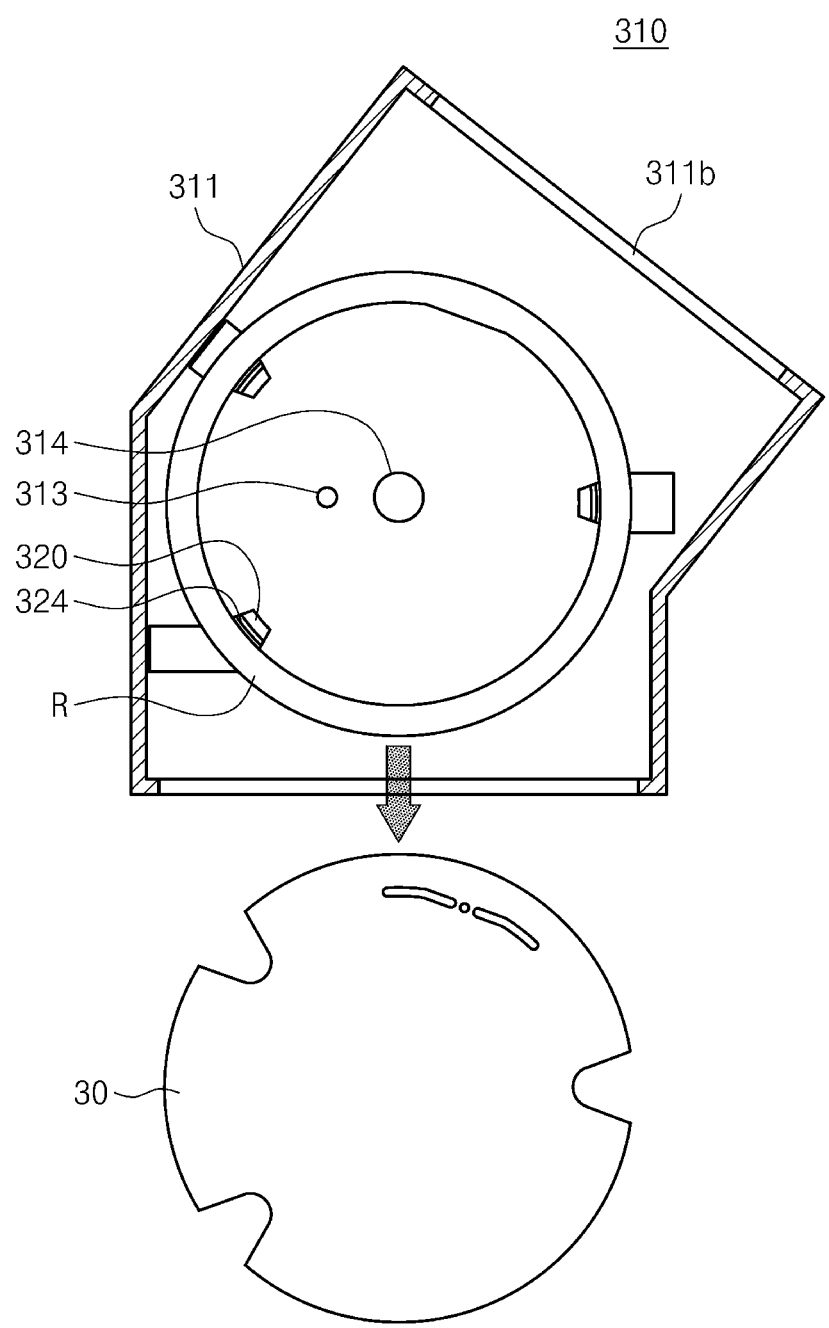
FIG. 19 is a view illustrating an appearance, in which a ring carrier of FIG. 18 is carried out from a load lock chamber.

Furthermore, when viewed from a top, the support shelves 320 may be disposed at locations that overlap the openings 32 formed in the above-described ring carrier 30. Accordingly, as illustrated in FIG. 18, when the first transfer hand 152 carries the ring carrier 30, on which the ring member "R" is positioned, into the load lock chamber 310 and the first transfer hand 152 is moved downwards, the ring member "R" is poisoned on the support shelves 320, and the ring carrier 30 may be moved downwards while being positioned on the first transfer hand 152. Thereafter, as illustrated in FIG. 19, when the first transfer hand 152 is retreated, the ring carrier 30 may be separated from the ring member "R" and be carried out from the load lock chamber 310.

Referring to FIG. 1 again, the transfer chamber 330 may be disposed between the load lock chamber 310 and the process chamber 370. The internal atmosphere of the transfer chamber 330 may be maintained in the vacuum pressure atmosphere. The second transfer robot 350 may be provided in the transfer chamber 330. The second transfer robot 350 may transfer the substrate "W" or the ring member "R" between the load lock chamber 310 and the process chamber 370. Furthermore, the second transfer robot 350 may have a second transfer hand 352.

Figure 20:
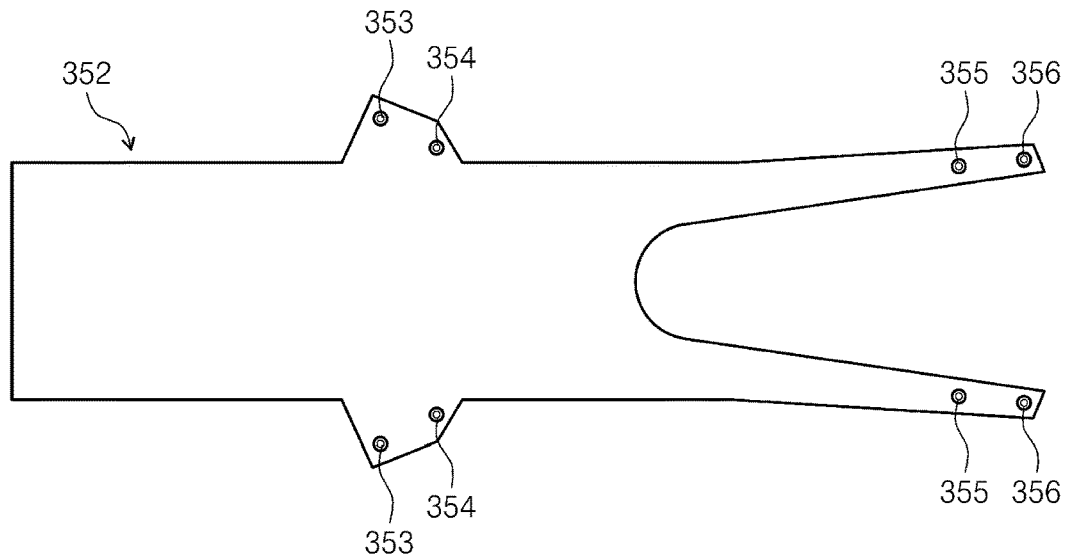
FIG. 20 is a view illustrating an appearance of a second transfer hand of FIG. 1.
Figure 21:
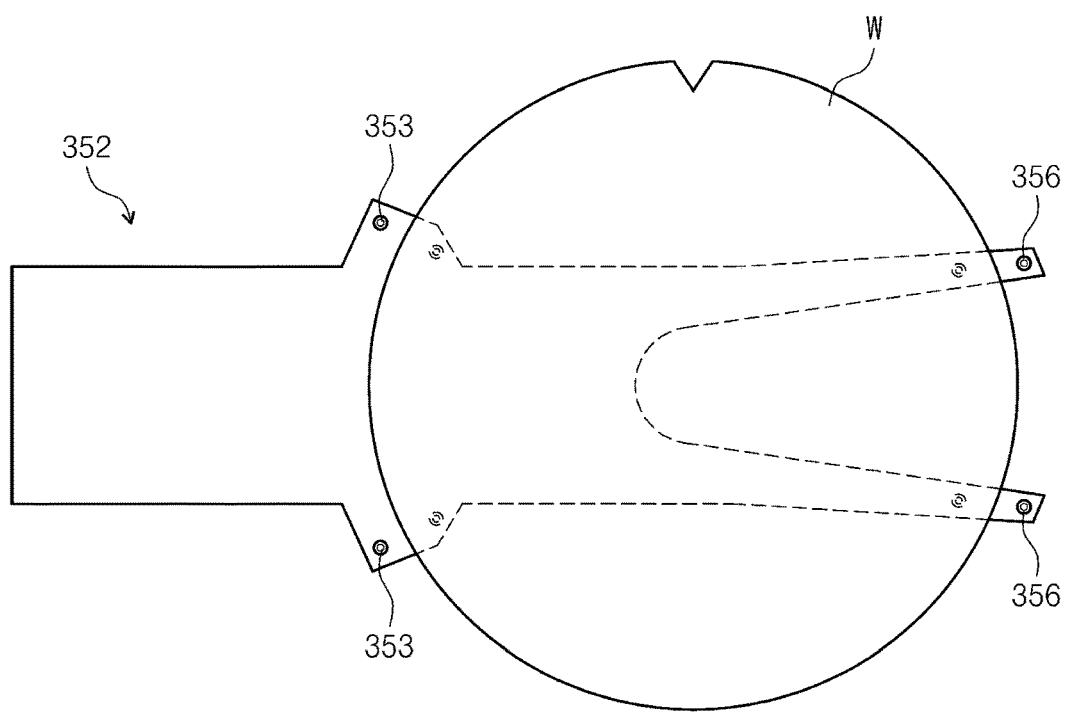
FIG. 21 is a view illustrating an appearance, in which a substrate is positioned on a second transfer hand of FIG. 20.
Figure 22:
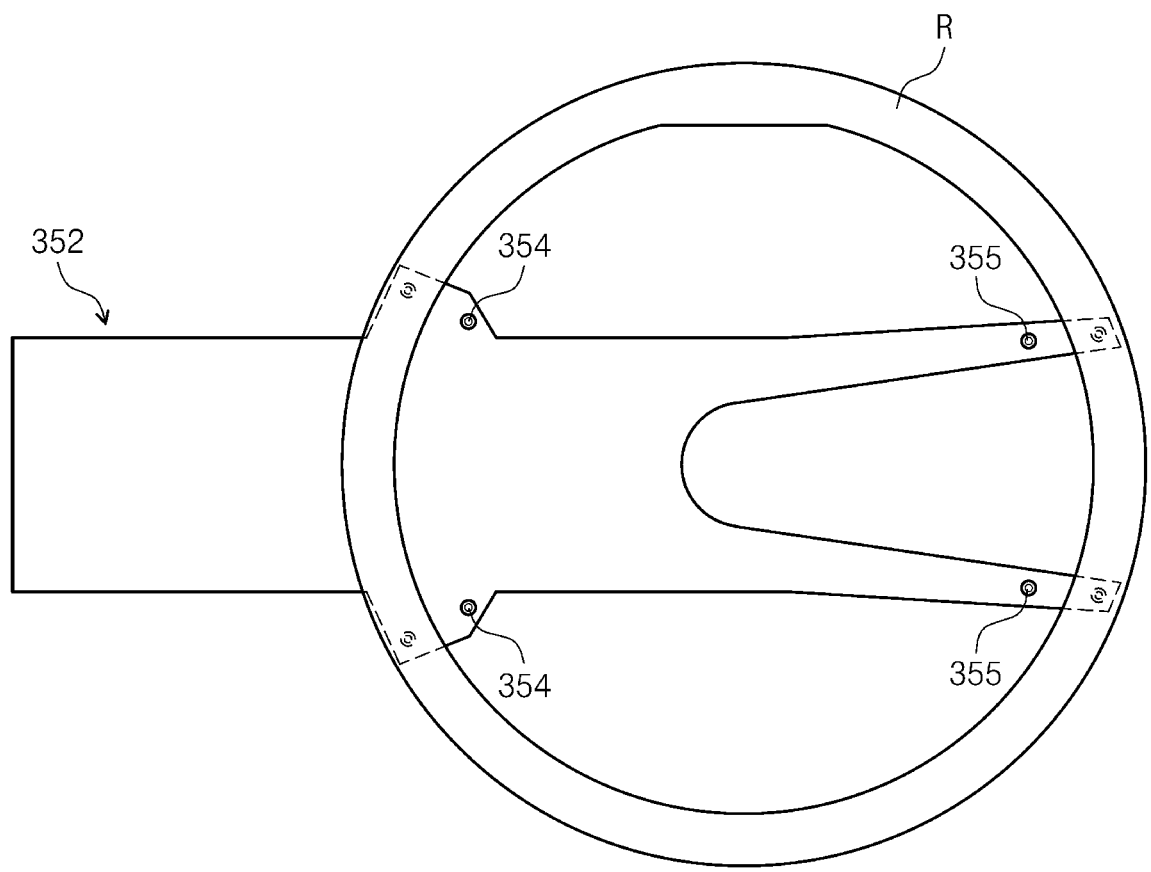
FIG. 22 is a view illustrating an appearance, in which a ring member is positioned on a second transfer hand of FIG. 20.

FIG. 20 is a view illustrating an appearance of a second transfer hand of FIG. 1. Referring to FIG. 20, the second transfer hand 352 of the second transfer robot 350 may have a size that is larger than that of the first transfer hand 152. A pair of first transfer pads 353, a pair of second transfer pads 354, a pair of third transfer pads 355, and a pair of fourth transfer pads 356 may be provided on the second transfer hand 352. The second transfer pad 354 and the third transfer pad 355 may be disposed between the first transfer pad 353 and the fourth transfer pad 356. The second transfer pad 354 and the third transfer pad 355 may be disposed on an inner side of an outer periphery of the substrate "W" when viewed from a top. That is, as illustrated in FIG. 21, the second transfer pad 354 and the third transfer pad 355 may support, among the substrate "W" and the ring member "R", the substrate "W". When viewed from a top, the first transfer pad 353 and the fourth transfer pad 356 may be disposed on an outer side of the outer periphery of the substrate "W" and the inner periphery of the ring member "R", and may be disposed on an inner side of the outer periphery of the ring member "R". That is, the second pad 326 may support, among the substrate "W" and the ring member "R", the ring member "R".

Referring to FIG. 1 again, one or more process chambers 370 may be connected to the transfer chamber 330. The process chamber 370 may be a chamber that performs a process on the substrate "W". The process chamber 370 may be a liquid treating chamber that treats the substrate "W" by supplying a treatment liquid to the substrate "W". Furthermore, the process chamber 370 may be a plasma chamber that treats the substrate "W" by using plasma. Furthermore, some of the process chambers 370 may be liquid treating chambers that treat the substrate "W" by supplying a treatment liquid to the substrate "W", and some of the process chambers 370 may be plasma chambers that treat the substrate "W" by using plasma. However, the present disclosure is not limited thereto, and a substrate treating process performed in the process chamber 370 may be variously modified to known substrate treating processes. Furthermore, when the process chamber 370 is a plasma chamber that treats the substrate "W" by using the plasma, the plasma chamber may be a chamber that performs an etching or ashing process of removing a thin film on the substrate "W" by using the plasma. However, the present disclosure is not limited thereto, and a plasma treatment process performed in the process chamber 370 may be variously modified to known plasma treatment processes.

Figure 23:
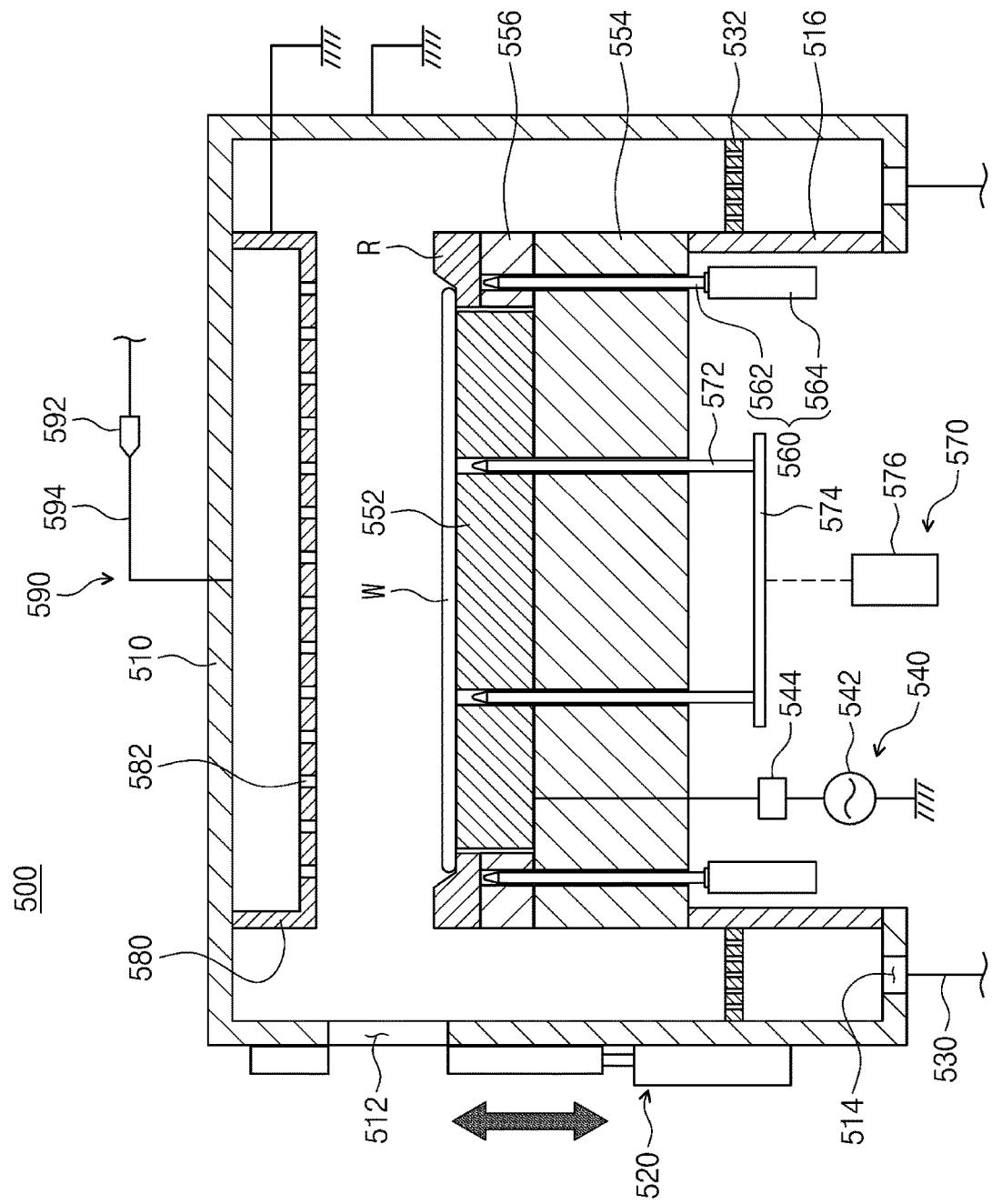
FIG. 23 is a view illustrating a substrate treating apparatus provided in a process chamber of FIG. 1.

FIG. 23 is a view illustrating a substrate treating apparatus provided in a process chamber of FIG. 1. Referring to FIG. 23, a substrate treating apparatus 500 provided in the process chamber 370 will be described in detail. The substrate treating apparatus 500 may treat the substrate "W" by transferring plasma to the substrate "W".

The substrate treating apparatus 500 may include a treatment container 510, a gate valve 520, an exhaust line 530, a power source unit 540, a support unit 550, a first lift pin module 560, a second lift pin module 570, a baffle plate 580, and a gas supply unit 590.

The treatment container 510 may have a treatment space. The treatment container 510 may be grounded. The treatment container 510 may provide the treatment space, in which the substrate "W" is treated. The treatment space of the treatment container 510 may be maintained substantially at a vacuum atmosphere when the substrate "W" is treated. An entrance 512, through which the substrate "W" or the ring member "R" is carried in and out, may be formed on one side of the treatment container 510. The gate valve 520 may selectively open and close the entrance 512.

An exhaust hole 514 may be formed on a bottom surface of the treatment container 510. The exhaust line 530 may be connected to the exhaust hole 514. The exhaust line 530 may exhaust a process gas, a process by-product, and the like supplied to the treatment space of the treatment container 510 to an outside of the treatment container 510 through the exhaust hole 514. Furthermore, an exhaust plate 532 that makes it possible to exhaust the treatment space more uniformly may be provided at an upper portion of the exhaust hole 514. The exhaust plate 532 may substantially have a ring shape when viewed from the top. Furthermore, at least one exhaust hole may be formed in the exhaust plate 532. The operator may select, among a plurality of exhaust plates 532 having various shapes and sizes, the exhaust plate 532 that may uniformly exhaust the treatment space and install the exhaust plate 532 at an upper portion of the exhaust hole 514.

Furthermore, the treatment container 510 may further include a support member 516. The support member 516 may support at least a portion of a base included in the support unit 550, which will be described below. For example, the support member 516 may be configured to support a lower portion of an insulation plate 554 included in the support unit 550.

The power source unit 540 may generate RF power that excites the process gas supplied by the gas supply unit 590, which will be described below, in a plasma state. The power source unit 540 may include a power source 542 and a matcher 544. The power source 542 and the matcher 544 may be installed on an electric power transmission line. Furthermore, the electric power transmission line may be connected to a chuck 552.

The support unit 550 may support the substrate "W" in the treatment container 510 of the treatment container 510. The support unit 550 may include the chuck 552, the insulation plate 554, and a quartz ring 556.

The chuck 552 may have a support surface that supports the substrate "W". The chuck 552 may support the substrate "W", and may chuck the supported substrate "W". For example, an electrostatic plate (not illustrated) may be provided in the chuck 552, and the chuck 552 may be an electrostatic chuck that chucks the substrate "W" by using an electrostatic force. For example, the chuck 552 may be an electrode static chuck (ESC). However, the present disclosure is not limited thereto, and the chuck 552 may chuck the substrate "W" in a vacuum suction scheme.

The insulation plate 554 may have a circular shape when viewed from a top. The above-described chuck 552, and the quartz ring 556, which will be described below, may be positioned on the insulation plate 554. The insulation plate 554 may be a dielectric body. For example, the insulation plate 554 may be formed of a material including ceramics.

The quartz ring 556 may be formed of a material including quartz. The quartz ring 556 may substantially have a ring shape when viewed from the top. The quartz ring 556 may substantially have a shape that surrounds the chuck 552 when viewed from the top. The quartz ring 556 may have a shape that surrounds the substrate "W" supported by the chuck 552 when viewed from the top. Furthermore, the ring member "R" (for example, a focusing ring) may be positioned on the upper surface of the inner side of the quartz ring 556.

When viewed from a top, the ring member "R" positioned on an upper surface of the quartz ring 556 may have a ring shape. The ring member "R" may have a shape, of which a height of an upper surface of an inner side is lower than a height of an upper surface of an outer side thereof. A lower surface of a peripheral area of the substrate "W" may be positioned on the upper surface of the inner side of the ring member "R". Furthermore, the ring member "R" may have an inclined surface that is inclined upwards in a direction that faces an outer side of the substrate "W" from a center of the substrate "W" between the upper surface of the inner side and the upper surface of the outer side thereof. Accordingly, even though a location of the substrate "W" is rather inaccurate when the substrate "W" is positioned on the upper surface of the inner side of the ring member "R", the substrate "W" may be properly positioned on the upper surface or the inner side of the ring member "R" while the substrate "W" is slid along the inclined surface of the ring member "R".

The first lift pin module 560 may elevate the ring member "R" positioned on the upper surface of the quartz ring 556. The first lift pin module 560 may include a first lift pin 562 and a first pin driving part 564. A plurality of first lift pins 562 may be provided, and a plurality of first pin driving parts 564 that move the first lift pins 562 upwards and downwards may be provided. Furthermore, when viewed from a top, the first lift pins 562 may be disposed not to overlap the chuck 552. The lift pin 562 may be moved upwards and downwards along the pin holes formed in the insulation plate 554 and/or the quartz ring 556. Furthermore, the pin driving part 564 may be a cylinder that uses a pneumatic pressure or a hydraulic pressure, or a motor.

The second lift pin module 570 may elevate the substrate "W". The second lift pin module 570 may include a second lift pin 572, an elevation plate 574, and a second pin driving part 576. The second lift pin 572 may be coupled to the elevation plate 574. The elevation plate 574 may be moved upwards and downwards by the second pin driving part 576.

The baffle plate 580 may be provided at an upper portion of the support unit 550. The baffle plate 580 may be formed of an electrode material. At least one baffle hole 582 may be formed in the baffle plate 580. For example, a plurality of baffle holes 582 may be formed, and may be uniformly formed in a whole area of the baffle plate 580 when viewed from the top. The baffle plate 580 makes it possible to uniformly deliver the process gas supplied by the gas supply unit 590, which will be described below, to the substrate "W".

The gas supply unit 590 may supply the process gas into the treatment space of the treatment container 510. The process gas may be a gas that is excited into a plasma state by the power source unit 540, which will be described below. The gas supply unit 590 may include a gas supply source 592 and a gas supply line 594. One end of the gas supply line 594 may be connected to the gas supply source 592, and an opposite end of the gas supply line 594 may be connected to an upper portion of the treatment container 510. Accordingly, the process gas delivered by the gas supply source 592 may be supplied to an upper area of the baffle plate 580 through the gas supply line 594. The process gas supplied to the upper area of the baffle plate 580 may be introduced into the treatment space of the treatment container 510 through the baffle hole 582.

Referring to FIG. 1 again, the controller 700 may control the substrate treating apparatus 10. The controller 700 may control the index unit 100 and the process executing unit 300. The controller 700 may control the first transfer robot 150 and the second transfer robot 350. The controller 700 may control the substrate treating apparatus 500 provided in the process chamber 370 such that the substrate "W" may be treated in the process chamber 370 by using the plasma. Furthermore, the controller 700 may control configurations of the substrate treating apparatus 10 such that a transfer method for transferring the ring member "R", which will be described below, may be performed by the substrate treating apparatus 10.

Furthermore, the controller 700 may include a process controller including a microprocessor (computer) that executes control of the substrate treating apparatus 10, a keyboard for inputting commands to allow an operator to manage the substrate treating apparatus 10, a user interface including a display that visualizes and displays an operation situation of the substrate treating apparatus 10, and a memory unit for storing a control program for executing processing executed by the substrate treating apparatus 10 under a control of the process controller, or a program for executing processing, that is, a processing recipe in elements according to various data and processing conditions. Furthermore, the user interface and the memory unit may be connected to the process controller. The processing recipe may be stored in a memory medium of the memory unit, and the memory medium may be a hard disk, and may be a transportable disk such as a CD-ROM, a DVD, or the like, a semiconductor memory such as a flash memory.

Hereinafter, the method for transferring the ring member "R" according to an embodiment of the present disclosure will be described. In detail, a transfer sequence of transferring the ring member "R" that is unused to the process chamber 370 will be described.

When an exchange period of the ring member "R" mounted on the process chamber 370 is reached, the OHT apparatus may transfer the second container 22 to the load pot 110. When the second container 22 is transferred to the load pot 110, the first transfer robot 150 may carry the ring carrier 30 received in the second container 22 out of the second container 22 by using the first transfer hand 152. Then, a direction of the ring carrier 30 may be received in the second container 22 while being aligned. When it is necessary to align the direction of the ring carrier 30, the first transfer robot 150 may transfer the ring carrier 30 to the alignment chamber 170, and the alignment unit 200 may align the ring carrier 30 in a state, in which the ring member "R" is not positioned thereon.

Thereafter, the first transfer hand 152 may enter the second container 22 in a state, in which it supports the ring carrier 30. When the first transfer hand 152 completely enters the second container 22, the first transfer hand 152 may move upwards to position the unused ring member "R" received in the second container 22 on the ring carrier 30. Then, the ring member "R" may be in a state, in which the direction thereof is aligned by the alignment pin 22b in the second container. Accordingly, the ring member "R" may be positioned on the ring carrier 30 in a state, in which the direction thereof is aligned.

When the ring member "R" is positioned on the ring carrier 30, the ring carrier 30 may be transferred to the alignment chamber 170, and the direction thereof may be aligned by the alignment unit 200. After the direction of the ring carrier 30 in a state, in which the ring member "R" is positioned, is aligned by the alignment unit 200, the first transfer robot 150 may transfer the ring carrier 30 in a state, in which the ring member "R" is positioned thereon, to the load lock chamber 310.

When the first transfer hand 152 completely enters the load lock chamber 310, the first transfer hand 152 may be moved downwards. Accordingly, the ring member "R" on the ring carrier 30 may be seated on the support shelves 320, and the ring carrier 30 may be separated from the ring member "R". When the ring carrier 30 is separated from the ring member "R", it may be carried out from the load lock chamber 310. The ring member "R" seated on the support shelves 320 of the load lock chamber 310 may be carried out by the second transfer hand 352 of the second transfer robot 350, and may be transferred into the process chamber 370.

The ring member "R" used in the process chamber 370 is carried out in a reverse sequence to the above-described carry-in sequence of the unused ring member "R", a repeated description thereof will be omitted.

Although it has been described in the above-described example that the substrate "W" is received in the first container 21 and the ring member "R" is received in the second container 22, the present disclosure is not limited thereto. For example, the substrate "W" and the ring member "R" may be received in the same container 20.

Although it has been described in the above-described example that the ring carrier 30 may be received in the second container 22, the present disclosure is not limited thereto. For example, the ring carrier 30 may be used to transfer the ring member "R" as the ring carrier 30 is received in a separate buffer space (not illustrated) of the substrate treating apparatus 10 and the first transfer robot 150 carries out the ring carrier 30 from the buffer space.

Figure 24:
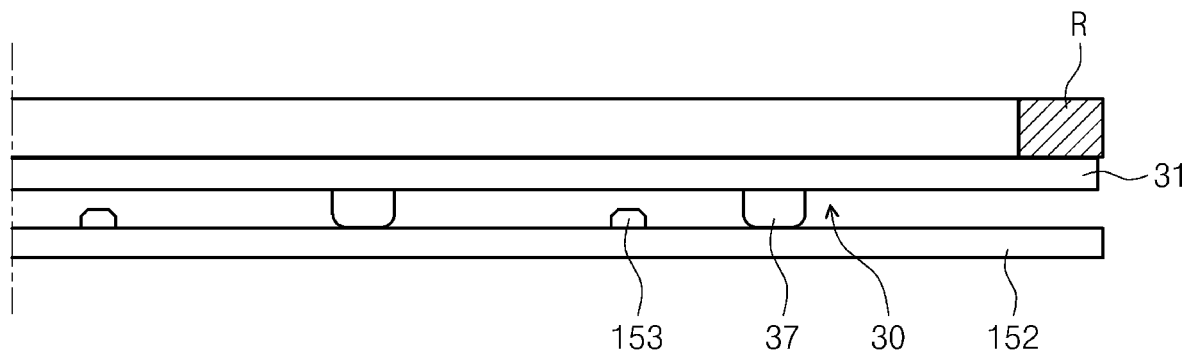
FIG. 24 is a view illustrating an appearance of a ring carrier according to another embodiment of the present disclosure.
Figure 25:
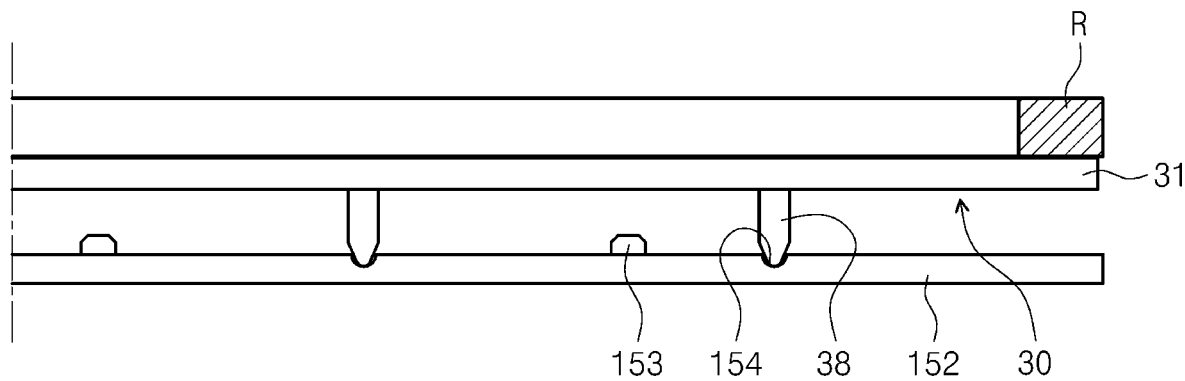
FIG. 25 is a view illustrating an appearance of a ring carrier according to another embodiment of the present disclosure.

In the above-described example, it has been described as an example that the ring carrier 30 is supported while contacting the first support pad 153 provided on the upper surface of the first transfer hand 152, but the present disclosure is not limited thereto. For example, as illustrated in FIG. 24, one or more (for example, a plurality of) slide preventing pads 37 may be provided on a lower surface of the body 31 of the ring carrier 30. An upward/downward thickness of the slide preventing pad 37 may be larger than an upward/downward thickness of the first support pad 153. That is, when the ring carrier 30 has the slide preventing pad 37, the lower surface of the body 31 may be spaced apart from the first support pad 153. Accordingly, a problem, in which the first support pad 153 is contaminated due to the transfer of the ring carrier 30, may be reduced. Similarly, as illustrated in FIG. 25, the ring carrier 30 may include one or more (for example, a plurality of) slide preventing pins 38 that protrudes downwards from the lower surface of the body 31. One end of the slide preventing pin 38 may be inserted into a groove 154 formed on the upper surface of the first transfer hand 152, and may space the lower surface of the body 31 away from the first support pad 153.

According to an embodiment of the present disclosure, the ring member may be effectively transferred.

Furthermore, according to an embodiment of the present disclosure, the ring member may be transferred without changing the structure of the transfer hand.

Furthermore, according to an embodiment of the present disclosure, sliding and distortion of the ring member may be minimized when the ring member is transferred.

The effects of the present disclosure are not limited to the above-mentioned effects, and the unmentioned effects can be clearly understood by those skilled in the art to which the present disclosure pertains from the specification and the accompanying drawings.

The above detailed description exemplifies the present disclosure. Furthermore, the above-mentioned contents describe the embodiment of the present disclosure, and the present disclosure may be used in various other combinations, changes, and environments. That is, the present disclosure can be modified and corrected without departing from the scope of the present disclosure that is disclosed in the specification, the equivalent scope to the written disclosures, and/or the technical or knowledge range of those skilled in the art. The written embodiment describes the best state for implementing the technical spirit of the present disclosure, and various changes required in the detailed application fields and purposes of the present disclosure can be made. Accordingly, the detailed description of the present disclosure is not intended to restrict the present invention in the disclosed embodiment state. Furthermore, it should be construed that the attached claims include other embodiments.

What is claimed is:

1. A ring carrier for transferring a ring member, the ring carrier comprising:
   a body having a plate shape and an alignment hole, wherein the alignment hole passes through the body; and
   a guide part protruding from an upper surface of the body to face an inner periphery of the ring member,
   wherein the alignment hole passing through the body is configured to align the ring carrier in a predetermined direction.

2. The ring carrier of claim 1,
wherein the guide part faces a flat zone of the ring member.
3. The ring carrier of claim 1,
wherein the body has a disk shape.
4. The ring carrier of claim 1,
wherein the guide part includes:
a first guide part; and
a second guide part spaced apart from the first guide part, and
wherein the alignment hole is disposed between the first guide part and the second guide part.
5. The ring carrier of claim 1, further comprising:
a plurality of notches disposed at a peripheral area of the body and passing through the body.
6. The ring carrier of claim 5,
wherein the body includes an outer periphery.
7. The ring carrier of claim 1, further comprising:
one or more slide preventing pads provided on a lower surface of the body.
8. The ring carrier of claim 1, further comprising:
a side preventing pin protruding downwards from a lower surface of the body.
9. A substrate treating system comprising:
a first chamber provided with a transfer robot having a transfer hand;
a second chamber connected to the first chamber;
a ring carrier supporting a ring member during a time when the ring member is transferred between the first chamber and the second chamber; and
an alignment unit attached to the first chamber and configured to rotate the ring carrier to a predetermined direction,
wherein the ring carrier includes:
a body having a disk shape;
a guide boss configured to prevent the ring member positioned on the body of the ring carrier from sliding during a time when the ring member is transferred between the first chamber and the second chamber; and
an alignment hole passing through the body, and
wherein the alignment unit is configured to rotate the ring carrier such that the alignment hole of the ring carrier is aligned to the predetermined direction.
10. The substrate treating system of claim 9,
wherein a substrate with a notch is provided on the ring carrier, and
wherein the alignment hole overlaps the notch of the substrate.
11. The substrate treating system of claim 9,
wherein the guide boss is adjacent to a flat zone of the ring member.
12. The substrate treating system of claim 11,
wherein the guide boss includes:
a flat portion adjacent to the flat zone, wherein the flat portion extends along the flat zone; and
a round portion connected to the flat portion and extending along a round zone of the ring member.
13. The substrate treating system of claim 12,
wherein an outer periphery of the round portion of the ring carrier and an inner periphery of the round zone of the ring member have the same radius of curvature.
14. The substrate treating system of claim 12,
wherein the guide boss includes:
a first guide boss; and
a second guide boss spaced apart from the first guide boss, and
wherein a shape of the second guide boss is symmetrical to a shape of the first guide boss.
15. The substrate treating system of claim 9,
wherein the ring carrier includes a plurality of notches at a peripheral area of the body, the plurality of notches passing through the body, and
wherein the plurality of notches are positioned such that at a position where the ring carrier is in the second chamber, each of the plurality of notches overlaps a corresponding support shelf provided in the second chamber when viewed from a top of the substrate treating system.
16. The substrate treating system of claim 15,
wherein the body includes an outer periphery.
17. The substrate treating system of claim 9,
wherein the alignment unit includes:
a chuck configured to support and rotate the ring carrier;
an irradiation part configured to irradiate light toward the alignment hole of the ring carrier supported by the chuck; and
a light receiving part configured to receive the light that passes through the alignment hole.
18. A substrate treating system comprising:
an index chamber provided with a transfer robot, wherein an interior of the index chamber is maintained at an atmospheric pressure;
a process chamber configured to treat a substrate by using plasma;
a load lock chamber disposed between the index chamber and the process chamber, wherein an interior of the load lock chamber is at one of the atmospheric pressure and a vacuum pressure lower than the atmospheric pressure;
a ring carrier configured to transfer a ring member among the process chamber, the load lock chamber, and the index chamber; and
a controller,
wherein the controller controls the transfer robot such that a hand of the transfer robot transfers the ring carrier positioned on the ring member between the load lock chamber and the index chamber,
wherein the ring carrier includes:
a body having a disk shape;
a guide part protruding from an upper surface of the body to face a flat zone of the ring member; and
an alignment hole passing through the body, and
wherein the ring carrier is aligned to a predetermined direction using the alignment hole.
19. The substrate treating system of claim 18, further comprising:
an alignment unit configured to align a direction of a notch of the substrate in the predetermined direction or the alignment hole of the ring carrier in the predetermined direction, and
wherein the alignment hole overlaps the notch when viewed in a plan view.
20. The substrate treating system of claim 18,
wherein the load lock chamber includes:
a plurality of support shelves supporting the substrate or the ring member, and
wherein the ring carrier further includes a plurality of notches at a peripheral area of the body, the plurality of notches passing through the body, and
wherein each of the plurality of notches overlaps a corresponding support shelf of the plurality of support shelves when viewed from in a plan view.

* * * * *